(12) United States Patent
Kano et al.

(10) Patent No.: US 8,519,416 B2
(45) Date of Patent: Aug. 27, 2013

(54) METHOD OF FABRICATING NITRIDE-BASED SEMICONDUCTOR LIGHT-EMITTING DEVICE AND NITRIDE-BASED SEMICONDUCTOR LIGHT-EMITTING DEVICE

(75) Inventors: Takashi Kano, Osaka (JP); Masayuki Hata, Osaka (JP); Yasuhiko Nomura, Osaka (JP)

(73) Assignee: Future Light, LLC, Mountain View, CA (US)

( * ) Notice: Subject to any disclaimer, the term of this patent is extended or adjusted under 35 U.S.C. 154(b) by 68 days.

(21) Appl. No.: 12/576,813

(22) Filed: Oct. 9, 2009

(65) Prior Publication Data

US 2010/0025701 A1 Feb. 4, 2010

Related U.S. Application Data

(62) Division of application No. 11/523,531, filed on Sep. 20, 2006, now abandoned.

(30) Foreign Application Priority Data

Mar. 22, 2006 (JP) .................................. 2006-78726
Aug. 31, 2006 (JP) ................................ 2006-236165

(51) Int. Cl.
*H01L 33/00* (2010.01)

(52) U.S. Cl.
USPC .................. 257/96; 257/94; 257/97; 257/103; 257/613; 257/614; 257/618; 257/622; 257/627; 257/628; 257/E33.005; 257/E33.006; 257/E33.025; 257/E33.028; 257/E33.03; 257/E33.033; 257/E33.034

(58) Field of Classification Search
USPC ...................... 257/E33.025, E33.028, E33.03, 257/E33.033, E33.034, 94, 96, 97, 103, 613, 257/614, 618, 622, 627, 628, E33.005, E33.006
See application file for complete search history.

(56) References Cited

U.S. PATENT DOCUMENTS 6,734,503 B2 5/2004 Hata et al.
6,984,841 B2 1/2006 Tsuda et al.

(Continued)

FOREIGN PATENT DOCUMENTS

CN 1697273 11/2005
JP 2000-058981 A 2/2000

(Continued)

OTHER PUBLICATIONS

Chinese Office Action from corresponding case, English translation included, dated Oct. 30, 2009.
Official Action in a corresponding Japanese application, dated Feb. 23, 2010.

(Continued)

*Primary Examiner* — Jay C Kim
(74) *Attorney, Agent, or Firm* — Ditthavong Mori & Steiner, P.C.

(57) ABSTRACT

A nitride-based semiconductor light-emitting device capable of suppressing reduction of characteristics and a yield and method of fabricating the same is described. The method of fabricating includes the steps of forming a groove portion on a nitride-based semiconductor substrate by selectively removing a prescribed region of a second region of the nitride-based semiconductor substrate other than a first region corresponding to a light-emitting portion of a nitride-based semiconductor layer up to a prescribed depth and forming the nitride-based semiconductor layer having a different composition from the nitride-based semiconductor substrate on the first region and the groove portion of the nitride-based semiconductor substrate.

11 Claims, 17 Drawing Sheets

(56) References Cited

U.S. PATENT DOCUMENTS

| | | | |
|---|---|---|---|
| 7,692,200 B2 | 4/2010 | Kamikawa et al. | |
| 2005/0151153 A1 | 7/2005 | Kamikawa et al. | |
| 2005/0186694 A1* | 8/2005 | Takakura et al. | 438/28 |
| 2005/0221590 A1 | 10/2005 | Kano et al. | |
| 2005/0250234 A1 | 11/2005 | Kamikawa et al. | |
| 2006/0094244 A1 | 5/2006 | Yamada et al. | |
| 2006/0131590 A1 | 6/2006 | Takakura et al. | |
| 2007/0051961 A1 | 3/2007 | Kamikawa et al. | |

FOREIGN PATENT DOCUMENTS

| | | |
|---|---|---|
| JP | 2000058972 | 2/2000 |
| JP | 2002-246698 A | 8/2002 |
| JP | 2003017808 | 1/2003 |
| JP | 2003051612 | 2/2003 |
| JP | 2003124573 | 4/2003 |
| JP | 2003179311 | 6/2003 |
| JP | 2004140213 | 5/2004 |
| JP | 2004260152 | 9/2004 |
| JP | 2004356454 | 12/2004 |
| JP | 2005197347 | 7/2005 |
| JP | 2006134926 | 5/2006 |
| JP | 2006-190980 A | 7/2006 |

OTHER PUBLICATIONS

Office Action from corresponding Chinese Patent Application No. 2006101543585 dated Apr. 14, 2010; English translation included.

Chinese Office Action issued on Aug. 4, 2010 in the corresponding to Chinese Patent application No. 2006101543585.

Japanese Office Action issued on Jan. 25, 2011 in the corresponding Japanese Patent application No. 2006-078726.

Mitsuru Funato, et al., "Blue, Green, and Amber InGaN/GaN Light-Emitting Diodes on Semipolar {11-22} GaN Bulk Substrates", Japan Journal of Applied Physics, Jun. 30, 2006, vol. 45, No. 26, pp. L659-L662.

Japanese Office Action issued on May 24, 2011 in the corresponding Japanese Patent application No. 2006-236165.

* cited by examiner

US 8,519,416 B2

METHOD OF FABRICATING NITRIDE-BASED SEMICONDUCTOR LIGHT-EMITTING DEVICE AND NITRIDE-BASED SEMICONDUCTOR LIGHT-EMITTING DEVICE

CROSS REFERENCE TO RELATED APPLICATIONS

The instant application is a Divisional application of U.S. patent application Ser. No. 11/523,531, filed Sep. 20, 2006, which application claims priority to Japanese Pat. App. Nos. 2006-78726 and 2006-236165. The contents of each application identified above incorporated herein by reference in their entireties.

BACKGROUND OF THE INVENTION

1. Field of the Invention

The present invention relates to a method of fabricating a nitride-based semiconductor light-emitting device and a nitride-based semiconductor light-emitting device, and more particularly, it relates to a method of fabricating a nitride-based semiconductor light-emitting device having a nitride-based semiconductor layer formed on a nitride-based semiconductor substrate and a nitride-based semiconductor light-emitting device.

2. Description of the Background Art

A nitride-based semiconductor light-emitting device such as a nitride-based semiconductor laser diode having a nitride-based semiconductor layer formed on a GaN substrate employed as a nitride-based semiconductor substrate is known in general, as disclosed in Japanese Patent Laying-Open No. 2000-58972, for example.

The aforementioned Japanese Patent Laying-Open No. 2000-58972 discloses a nitride-based semiconductor laser diode formed by successively growing an n-type nitride-based semiconductor layer, a light-emitting layer and a p-type nitride-based semiconductor layer on an n-type GaN substrate having a planar surface. In the conventional nitride-based semiconductor laser diode disclosed in the aforementioned Japanese Patent Laying-Open No. 2000-58972, an n-type cladding layer formed on the n-type GaN substrate as the n-type nitride-based semiconductor layer has a structure obtained by alternately stacking 100 n-type AlGaN layers and 100 undoped GaN layers with each other.

In the conventional nitride-based semiconductor laser diode disclosed in the aforementioned Japanese Patent Laying-Open No. 2000-58972, however, the quantity of cracks formed on the n-type AlGaN layers is disadvantageously increased when the n-type AlGaN layers constituting the n-type cladding layer are grown on the n-type GaN substrate having the planar surface. More specifically, when an n-type AlGaN layer 202 grown on an n-type GaN substrate 201 having a planar surface as shown in FIG. 32 is strained due to the difference between the lattice constants of the n-type GaN substrate 201 and the n-type AlGaN layer 202, it is difficult to relax this strain. When the n-type AlGaN layer 202 is grown on the n-type GaN substrate 201 having the planar surface, therefore, the quantity of cracks 203 formed on the n-type AlGaN layer 202 to extend in the [11-20] direction (see FIG. 34) and the [1-210] and [-2110] directions (see FIG. 34) equivalent to the [11-20] direction is increased as shown in FIG. 33. Referring to FIG. 34, θ is 120°.

When the quantity of cracks formed on the n-type AlGaN layers (n-type nitride-based semiconductor layer) is increased in the nitride-based semiconductor laser diode disclosed in the aforementioned Japanese Patent Laying-Open No. 2000-58972, a large number of cracks are disadvantageously formed also on the light-emitting layer and the p-type nitride-based semiconductor layer successively formed on the n-type nitride-based semiconductor layer. In the nitride-based semiconductor laser diode disclosed in the aforementioned Japanese Patent Laying-Open No. 2000-58972, therefore, a large number of cracks formed on a nitride-based semiconductor device layer including the n-type nitride-based semiconductor layer, the light-emitting layer and the p-type nitride-based semiconductor layer disadvantageously increase a leakage current not supplied to a light-emitting portion of the nitride-based semiconductor device layer and hinder a transmission of a light. Consequently, the characteristics and the yield of the nitride-based semiconductor laser diode are disadvantageously reduced in the nitride-based semiconductor laser diode disclosed in the aforementioned Japanese Patent Laying-Open No. 2000-58972.

SUMMARY OF THE INVENTION

The present invention has been proposed in order to solve the aforementioned problem, and an object of the present invention is to provide a method of fabricating a nitride-based semiconductor light-emitting device capable of suppressing reduction of characteristics and a yield.

Another object of the present invention is to provide a nitride-based semiconductor light-emitting device capable of suppressing reduction of characteristics and a yield.

In order to attain the aforementioned objects, a method of fabricating a nitride-based semiconductor light-emitting device according to a first aspect of the present invention comprises steps of forming a groove portion on a nitride-based semiconductor substrate by selectively removing a prescribed region of a second region of the nitride-based semiconductor substrate other than a first region corresponding to a light-emitting portion of a nitride-based semiconductor layer formed on the nitride-based semiconductor substrate up to a prescribed depth and forming the nitride-based semiconductor layer having a different composition from the nitride-based semiconductor substrate on the first region and the groove portion of the nitride-based semiconductor substrate.

In the method of fabricating a nitride-based semiconductor light-emitting device according to the first aspect of the present invention, as hereinabove described, the groove portion is formed on the nitride-based semiconductor substrate by selectively removing the prescribed region of the second region of the nitride-based semiconductor substrate other than the first region corresponding to the light-emitting portion up to the prescribed depth so that a material constituting the nitride-based semiconductor layer formed on the nitride-based semiconductor substrate by metal-organic chemical vapor deposition (MOCVD) is hardly deposited on the side surface of the groove portion when the side surface of the groove portion is perpendicular to the surface of the nitride-based semiconductor substrate and the opening width of the groove portion is gradually reduced from the bottom surface toward the opening end of the groove portion, whereby the thickness of a portion of the nitride-based semiconductor layer formed on the side surface of the groove portion can be reduced below that of a portion of the nitride-based semiconductor layer formed on the first region. Also when the nitride-based semiconductor layer is strained due to the difference between the lattice constants of the nitride-based semiconductor substrate and the nitride-based semiconductor layer in this case, the strain concentrates on the portion, having the smaller thickness, of the nitride-based semiconductor layer located on the side surface of the groove portion, whereby the nitride-based semiconductor layer can be rendered less strained on the portion located on the first region.

When the nitride-based semiconductor substrate is formed by a GaN substrate, the nitride-based semiconductor layer is formed by an AlGaN layer and the opening width of the groove portion is gradually increased from the bottom surface toward the opening end of the groove portion, the Al composition ratio of the portion of the nitride-based semiconductor layer formed on the side surface of the groove portion can be reduced below the Al composition ratio of the portion of the nitride-based semiconductor layer formed on the first region. This is conceivably because Ga which is one of the constituents of the nitride-based semiconductor layer, more easily movable on a growth surface as compared with Al, easily moves toward the side surface of the groove portion when the nitride-based semiconductor layer is formed on the nitride-based semiconductor substrate by MOCVD or the like. Thus, the lattice constant of the portion, having the lower Al composition ratio, of the nitride-based semiconductor layer (AlGaN layer) located on the side surface of the groove portion so approaches the lattice constant of the nitride-based semiconductor substrate (GaN substrate) that the difference between the lattice constants of the nitride-based semiconductor substrate and the nitride-based semiconductor layer can be reduced on the portion, having the lower Al composition ratio, of the nitride-based semiconductor layer located on the side surface of the groove portion. When the nitride-based semiconductor layer is strained due to the difference between the lattice constants of the nitride-based semiconductor substrate and the nitride-based semiconductor layer in this case, the strain is relaxed on the portion, having the lower Al composition ratio, of the nitride-based semiconductor layer located on the side surface of the groove portion, whereby the nitride-based semiconductor layer can be rendered less strained on the portion located on the first region.

Thus, the strain caused on the nitride-based semiconductor layer can be reduced according to the first aspect, whereby the nitride-based semiconductor layer can be prevented from increase of the quantity of cracks disadvantageously resulting from remarkable strain caused on the nitride-based semiconductor layer. Therefore, cracks can be inhibited from increasing a leakage current not supplied to a light-emitting portion of the nitride-semiconductor layer and hindering a transmission of a light. Consequently, the nitride-based semiconductor light-emitting device can be inhibited from reduction of characteristics and a yield.

In the aforementioned structure, the nitride-based semiconductor substrate preferably includes a GaN substrate, and the nitride-based semiconductor layer preferably includes a layer containing Al, Ga and N. According to this structure, the nitride-based semiconductor light-emitting device comprising the GaN substrate and the nitride-based semiconductor layer including an AlGaN layer (layer containing Al, Ga and N) formed on the GaN substrate can be easily prevented from increase of the quantity of cracks formed on the nitride-based semiconductor layer due to the difference between the lattice constants of the GaN substrate and the AlGaN layer.

In the aforementioned structure provided with the nitride-based semiconductor substrate including the GaN substrate and the nitride-based semiconductor layer including the layer containing Al, Ga and N, the step of forming the nitride-based semiconductor layer on the nitride-based semiconductor substrate preferably includes a step of forming the nitride-based semiconductor layer on the upper surface of the first region of the nitride-based semiconductor substrate and the bottom surface and the side surface of the groove portion, and the Al composition ratio of a portion of the nitride-based semiconductor layer formed on the side surface of the groove portion is preferably lower than the Al composition ratio of a portion of the nitride-based semiconductor layer formed on the upper surface of the first region. According to this structure, the lattice constant of the portion, having the lower Al composition ratio, of the nitride-based semiconductor layer (AlGaN layer) located on the side surface of the groove portion approaches the lattice constant of the nitride-based semiconductor layer (GaN substrate), whereby the difference between the lattice constants of the nitride-based semiconductor substrate and the nitride-based semiconductor layer can be reduced in the portion, having the lower Al composition ratio, of the nitride-based semiconductor layer located on the side surface of the groove portion. When the nitride-based semiconductor layer is strained due to the difference between the lattice constants of the nitride-based semiconductor substrate and the nitride-based semiconductor layer, therefore, the strain can be easily relaxed on the portion, having the lower Al composition ratio, of the nitride-based semiconductor layer located on the side surface of the groove portion.

In this case, the step of forming the groove portion on the nitride-based semiconductor substrate preferably includes a step of forming the groove portion so that the opening width of the groove portion is gradually increased from the bottom surface toward the opening end of the groove portion. According to this structure, Ga which is one of the constituents of the nitride-based semiconductor layer, more easily movable on a growth surface as compared with Al, conceivably easily moves toward the side surface of the groove portion when the nitride-based semiconductor layer is formed on the nitride-based semiconductor substrate by MOCVD or the like, whereby the Al composition ratio of the portion of the nitride-based semiconductor layer formed on the side surface of the groove portion can be easily reduced below the Al composition ratio of the portion of the nitride-based semiconductor layer formed on the first region.

In the aforementioned structure, the step of forming the nitride-based semiconductor layer on the nitride-based semiconductor substrate preferably includes a step of forming the nitride-based semiconductor layer on the upper surface of the first region of the nitride-based semiconductor substrate and the bottom surface and the side surface of the groove portion, and the thickness of a portion of the nitride-based semiconductor layer formed on the side surface of the groove portion is preferably smaller than the thickness of a portion of the nitride-based semiconductor layer formed on the upper surface of the first region. According to this structure, strain concentrates on the portion, having the smaller thickness, of the nitride-based semiconductor layer located on the side surface of the groove portion when the nitride-based semiconductor layer is strained due to the difference between the lattice constants of the nitride-based semiconductor substrate and the nitride-based semiconductor layer, whereby the strain caused on the nitride-based semiconductor layer can be easily relaxed on the portion located on the first region.

In the aforementioned case where the thickness of the portion of the nitride-based semiconductor layer formed on the side surface of the groove portion is smaller than the thickness of the portion of the nitride-based semiconductor layer formed on the upper surface of the first region, the step of forming the groove portion on the nitride-based semiconductor substrate may include a step of forming the groove portion so that the side surface of the groove portion is substantially perpendicular to the surface of the nitride-based semiconductor substrate. According to this structure, the material constituting the nitride-based semiconductor layer formed on the nitride-based semiconductor substrate by MOCVD is hardly deposited on the side surface of the groove portion, whereby the thickness of the portion of the nitride-based semiconductor layer formed on the side surface of the groove portion can be easily reduced below that of the portion of the nitride-based semiconductor layer formed on the first region.

In the aforementioned case where the thickness of the portion of the nitride-based semiconductor layer formed on the side surface of the groove portion is smaller than the thickness of the portion of the nitride-based semiconductor layer formed on the upper surface of the first region, the step of forming the groove portion on the nitride-based semiconductor substrate may include a step of forming the groove portion so that the opening width of the groove portion is gradually reduced from the bottom surface toward the opening end of the groove portion. According to this structure, the material constituting the nitride-based semiconductor layer formed on the nitride-based semiconductor substrate by MOCVD or the like is more hardly deposited on the side surface of the groove portion as compared with a case where the side surface of the groove portion is substantially perpendicular to the surface of the nitride-based semiconductor substrate, whereby the thickness of the portion of the nitride-based semiconductor layer formed on the side surface of the groove portion can be more easily reduced below that of the portion of the nitride-based semiconductor layer formed on the first region.

In the aforementioned structure, the step of forming the groove portion on the nitride-based semiconductor substrate may include a step of forming a slender groove portion extending in a prescribed direction on the nitride-based semiconductor substrate. According to this structure, cracks extending in a direction intersecting with the prescribed direction can be inhibited from propagation across a region corresponding to the groove portion extending in the prescribed direction.

In the aforementioned structure, the surface of the nitride-based semiconductor substrate preferably has a (H,K,-H-K, L) plane (H and K are integers, and at least either H or K is nonzero). In general, a piezoelectric field generated in the nitride-based semiconductor layer is maximized when the surface of the nitride-based semiconductor substrate is the (0001) plane if in-plane strain is applied to the nitride-based semiconductor layer. Therefore, a piezoelectric field generated in a light-emitting layer consisting of a nitride-based semiconductor can be reduced by forming the surface of the nitride-based semiconductor substrate by the (H,K,-H,-K,L) plane other than the (0001) plane, whereby luminous efficiency can be improved.

In this case, the surface of the nitride-based semiconductor substrate preferably has a (H,K,-H-K,0) plane. According to this structure, no piezoelectric field is generated in the light-emitting layer consisting of a nitride-based semiconductor, whereby the luminous efficiency can be further improved.

In the aforementioned structure provided with the nitride-based semiconductor substrate including the surface having the (H,K,-H-K,L) plane, the surface of the nitride-based semiconductor substrate preferably has a (H,K,-H-K,L) plane (L is a nonzero integer). According to this structure, atomic-layer steps can be formed on the surface, whereby the mode of crystal growth tends to be step-flow growth starting from the steps, thereby improving crystallinity of the nitride-based semiconductor light-emitting device.

In the aforementioned structure provided with the nitride-based semiconductor substrate including the surface having the (H,K,-H-K,L) plane, the step of forming the groove portion on the nitride-based semiconductor substrate preferably includes a step of forming the groove portion extending along a [K,-H,H-K,0] direction on the nitride-based semiconductor substrate. According to this structure, cracks can be effectively inhibited from propagation in the direction intersecting with the [0001] direction easily causing cracks.

In the aforementioned structure, the step of forming the groove portion on the nitride-based semiconductor substrate may include a step of latticing slender groove portions extending in a first direction and a second direction intersecting with the first direction on the nitride-based semiconductor substrate to enclose the first region. According to this structure, cracks extending in a direction intersecting with the first direction can be inhibited from propagation across a region at least corresponding to the groove portion extending in the prescribed direction while cracks extending in a direction intersecting with the second direction can be inhibited from propagation across a region at least corresponding to the groove portion extending in the second direction. Thus, the groove portions can part cracks extending in both of the first and second directions, whereby the quantity of cracks can be more effectively prevented from increase.

In the aforementioned structure, the nitride-based semiconductor layer may include a layer, formed on the first region and the second region of the nitride-based semiconductor substrate, of a nitride-based semiconductor having a different composition from the nitride-based semiconductor substrate and a light-emitting layer of a nitride-based semiconductor formed at least on the first region.

A nitride-based semiconductor light-emitting device according to a second aspect of the present invention comprises a nitride-based semiconductor substrate including a first region corresponding to a light-emitting portion and a second region arranged to be adjacent to the first region through a step portion having a prescribed height and a nitride-based semiconductor layer, formed on the upper surface of the first region of the nitride-based semiconductor substrate and the side surface of the step portion, having a different composition from the nitride-based semiconductor substrate. The thickness of a portion of the nitride-based semiconductor layer formed on the side surface of the step portion is smaller than the thickness of a portion of the nitride-based semiconductor layer formed on the upper surface of the first region.

In the nitride-based semiconductor light-emitting device according to the second aspect of the present invention, as hereinabove described, the thickness of the portion of the nitride-based semiconductor layer formed on the side surface of the step portion of the nitride-based semiconductor substrate is reduced below the thickness of the portion of the nitride-based semiconductor layer formed on the upper surface of the first region, corresponding to the light-emitting portion, of the nitride-based semiconductor substrate so that strain concentrates on the portion, having the smaller thickness, of the nitride-based semiconductor layer located on the side surface of the step portion when the nitride-based semiconductor layer formed on the nitride-based semiconductor substrate by MOCVD or the like is strained due to the difference between the lattice constants of the nitride-based semiconductor substrate and the nitride-based semiconductor layer, whereby the nitride-based semiconductor layer can be rendered less strained on the portion located on the first region. Therefore, the nitride-based semiconductor layer can be prevented from increase of the quantity of cracks disadvantageously resulting from remarkable strain caused on the nitride-based semiconductor layer. Therefore, cracks can be inhibited from increasing a leakage current not supplied to the light-emitting portion of the nitride-semiconductor layer and hindering a transmission of a light. Consequently, the nitride-based semiconductor light-emitting device can be inhibited from reduction of characteristics and a yield.

In the aforementioned structure, the surface of the nitride-based semiconductor substrate preferably has a (H,K,-H-K,L) plane (H and K are integers, and at least either H or K is nonzero). In general, a piezoelectric field generated in the nitride-based semiconductor layer is maximized when the surface of the nitride-based semiconductor substrate is the (0001) plane if in-plane strain is applied to the nitride-based semiconductor layer, and a piezoelectric field generated in the nitride-based semiconductor layer when the surface of the nitride-based semiconductor substrate is not the (0001) plane is smaller than that generated when the surface of the nitride-based semiconductor substrate is the (0001) plane. Therefore, a piezoelectric field generated in a light-emitting layer consisting of a nitride-based semiconductor can be reduced by forming the surface of the nitride-based semiconductor substrate by the (H,K,-H-K,L) plane other than the (0001) plane, whereby luminous efficiency can be improved.

In the aforementioned structure provided with the nitride-based semiconductor substrate including the surface having the (H,K,-H-K,L) plane, the surface of the nitride-based semiconductor substrate preferably has a (H,K,-H-K,0) plane. According to this structure, no piezoelectric field is generated in the light-emitting layer consisting of a nitride-based semiconductor, whereby the luminous efficiency can be further improved.

In this case, the step portion is preferably so formed as to extend along a [K,-H,H-K,0] direction. According to this structure, cracks can be inhibited from propagation in the direction intersecting with the [0001] direction easily causing cracks.

In the aforementioned structure provided with the nitride-based semiconductor substrate including the surface having the (H,K,-H-K,L) plane, the surface of the nitride-based semiconductor substrate preferably has a (H,K,-H-K,L) plane (L is a nonzero integer). According to this structure, atomic-layer steps can be formed on the surface, whereby the mode of crystal growth tends to be step-flow growth starting from the steps, thereby improving crystallinity of the nitride-based semiconductor light-emitting device.

In the aforementioned structure, the nitride-based semiconductor layer may include a layer, formed on the first region and the second region of the nitride-based semiconductor substrate, of a nitride-based semiconductor having a different composition from the nitride-based semiconductor substrate and a light-emitting layer of a nitride-based semiconductor formed at least on the first region.

A nitride-based semiconductor light-emitting device according to a third aspect of the present invention comprises a nitride-based semiconductor substrate including a first region corresponding to a light-emitting portion and a second region arranged to be adjacent to the first region through a step portion having a prescribed height and a nitride-based semiconductor layer, formed on the upper surface of the first region of the nitride-based semiconductor substrate and the side surface of the step portion, having a different composition from the nitride-based semiconductor substrate and containing Al, Ga and N. The Al composition ratio of a portion of the nitride-based semiconductor layer formed on the side surface of the step portion is lower than the Al composition ratio of a portion of the nitride-based semiconductor layer formed on the upper surface of the first region.

In the nitride-based semiconductor light-emitting device according to the third aspect, as hereinabove described, the Al composition ratio of the portion of the nitride-based semiconductor layer, containing Al, Ga and N, formed on the side surface of the step portion of the nitride-based semiconductor substrate is so reduced below the Al composition ratio of the portion of the nitride-based semiconductor layer formed on the upper surface of the first region of the nitride-based semiconductor substrate corresponding to the light-emitting portion that the lattice constant of the portion, having the lower Al composition ratio, of the nitride-based semiconductor layer containing Al, Ga and N located on the side surface of the step portion approaches the lattice constant of the nitride-based semiconductor substrate having the different composition from the nitride-based semiconductor layer containing Al, Ga and N, whereby the difference between the lattice constants of the nitride-based semiconductor substrate and the nitride-based semiconductor layer can be reduced on the portion, having the lower Al composition ratio, of the nitride-based semiconductor layer located on the side surface of the step portion. Also when the nitride-based semiconductor layer is strained due to the difference between the lattice constants of the nitride-based semiconductor substrate and the nitride-based semiconductor layer, therefore, the strain can be relaxed on the portion, having the lower Al composition ratio, of the nitride-based semiconductor layer located on the side surface of the step portion, whereby the strain caused on the nitride-based semiconductor layer can be reduced. Thus, the nitride-based semiconductor layer can be prevented from increase of the quantity of cracks disadvantageously resulting from remarkable strain caused on the nitride-based semiconductor layer. Therefore, cracks can be inhibited from increasing a leakage current not supplied to the light-emitting portion of the nitride-semiconductor layer and hindering a transmission of a light. Consequently, the nitride-based semiconductor light-emitting device can be inhibited from reduction of characteristics and a yield.

In the aforementioned structure, the surface of the nitride-based semiconductor substrate preferably has a (H,K,-H-K,L) plane (H and K are integers, and at least either H or K is nonzero). In general, a piezoelectric field generated in the nitride-based semiconductor layer is maximized when the surface of the nitride-based semiconductor substrate is the (0001) plane if in-plane strain is applied to the nitride-based semiconductor layer, and a piezoelectric field generated in the nitride-based semiconductor layer when the surface of the nitride-based semiconductor substrate is not the (0001) plane is smaller than that generated when the surface of the nitride-based semiconductor substrate is the (0001) plane. Therefore, a piezoelectric field generated in a light-emitting layer consisting of a nitride-based semiconductor can be reduced by forming the surface of the nitride-based semiconductor substrate by the (H,K,-H-K,L) plane other than the (0001) plane, whereby luminous efficiency can be improved.

In this case, the surface of the nitride-based semiconductor substrate preferably has a (H,K,-H-K,0) plane. According to this structure, no piezoelectric field is generated in the light-emitting layer consisting of a nitride-based semiconductor, whereby the luminous efficiency can be further improved.

In the aforementioned structure provided with the nitride-based semiconductor substrate including the surface having the (H,K,-H-K,L) plane, the surface of the nitride-based semiconductor substrate preferably has a (H,K,-H-K,L) plane (L is a nonzero integer). According to this structure, atomic-layer steps can be formed on the surface, whereby the mode of crystal growth tends to be step-flow growth starting from the steps, thereby improving crystallinity of the nitride-based semiconductor light-emitting device.

In this case, the step portion is preferably so formed as to extend along a [K,-H,H-K,0] direction. According to this structure, cracks can be inhibited from propagation in the direction intersecting with the [0001] direction easily causing cracks.

In the aforementioned structure, the nitride-based semiconductor layer may include a layer, formed on the first region and the second region of the nitride-based semiconductor substrate, containing Al and Ga and a light-emitting layer of a nitride-based semiconductor formed at least on the first region.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the present invention are now described with reference to the drawings.

(First Embodiment)

A method of fabricating a nitride-based semiconductor laser diode according to a first embodiment of the present invention is described with reference to FIGS. 1 to 12 and 34.

Figure 1:
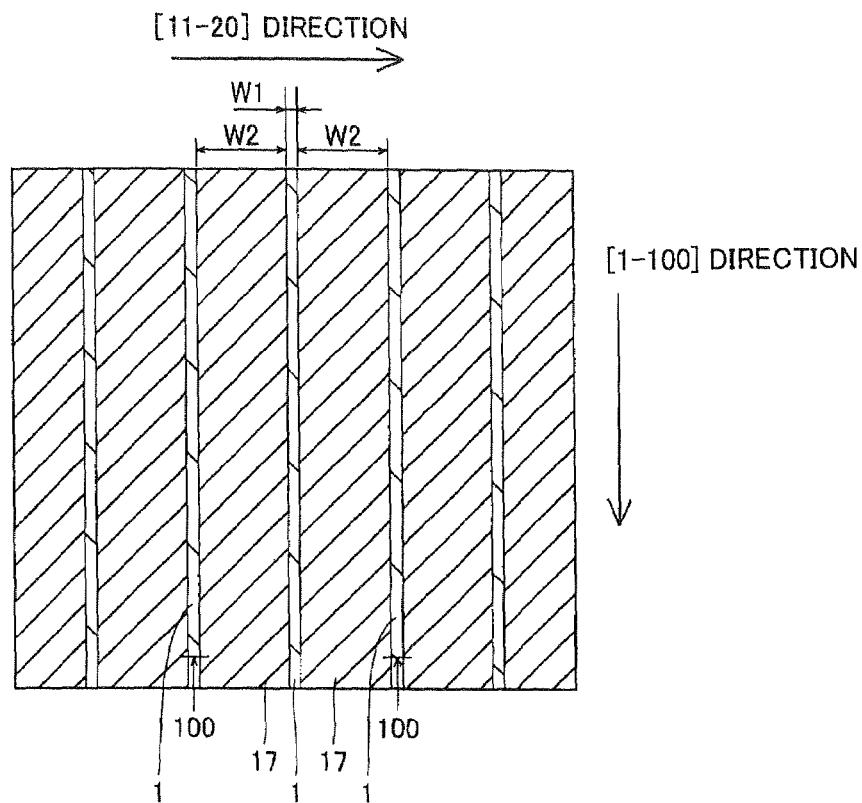
FIG. 1 is a plan view for illustrating a method of fabricating a nitride-based semiconductor laser diode according to a first embodiment of the present invention.
Figure 2:
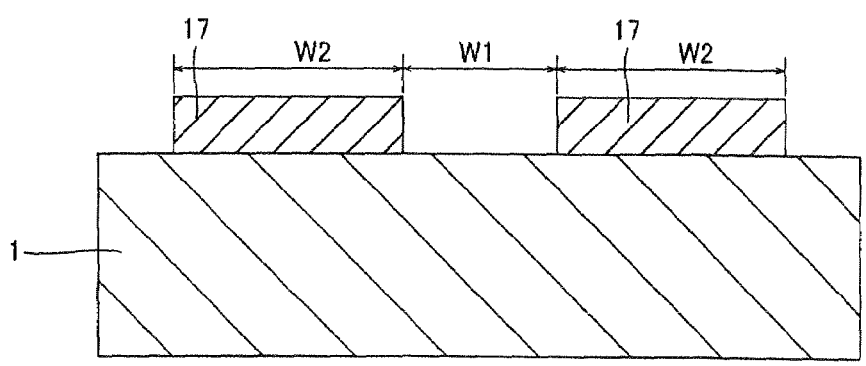
FIG. 2 is a sectional view taken along the line 100-100 in FIG. 1.

In the method of fabricating a nitride-based semiconductor laser diode according to the first embodiment, an n-type GaN substrate 1 having a surface of the (0001) plane with a low dislocation density is prepared, as shown in FIGS. 1 and 2. This n-type GaN substrate 1 has a lattice constant of about 0.3189 nm a-axis direction). The n-type GaN substrate 1 is an example of the "nitride-based semiconductor substrate" in the present invention. Then, striped (slender) mask layers 17 of Ni each having a thickness of about 0.4 μm are formed on prescribed regions of the n-type GaN substrate 1 by electron beam evaporation or the like. More specifically, the mask layers 17 are so formed as to extend in the [1-100] direction. Further, the distance W1 between the mask layers 17 adjacent to each other along the [11-20] direction is set to about 50 μm, while the width W2 of the mask layers 17 along the [11-20] direction is set to about 200 μm.

Figure 3:
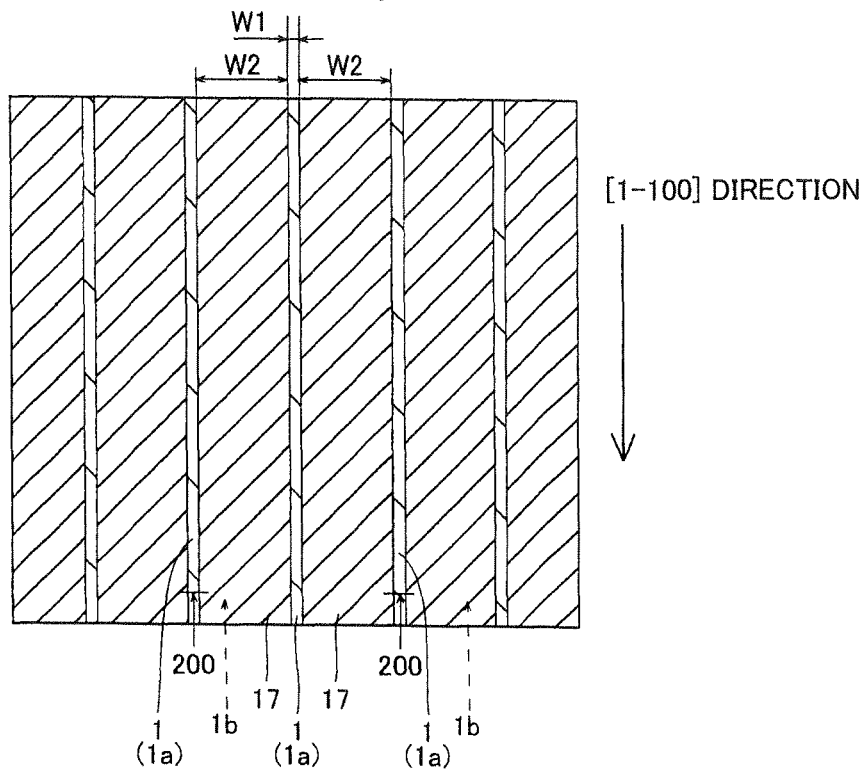
FIG. 3 is a plan view for illustrating the method of fabricating a nitride-based semiconductor laser diode according to the first embodiment of the present invention.
Figure 4:
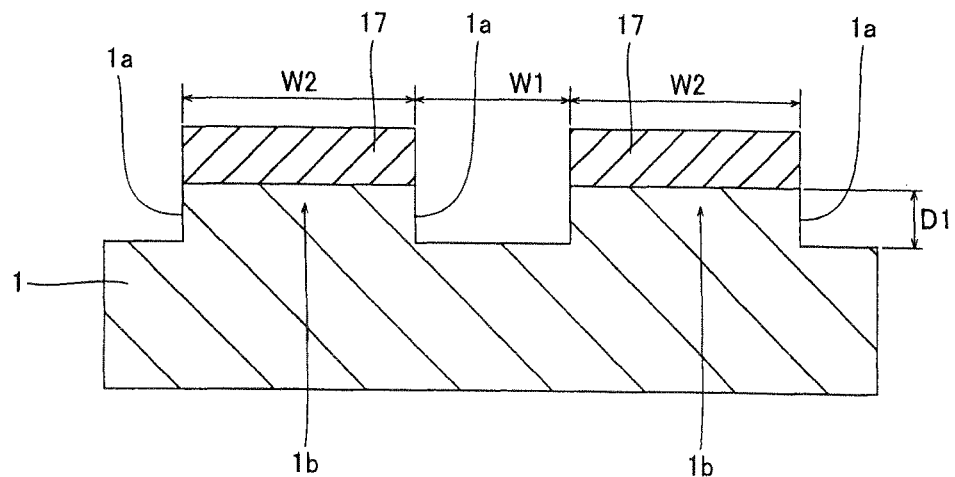
FIG. 4 is a sectional view taken along the line 200-200 in FIG. 3.

As shown in FIGS. 3 and 4, the mask layers 17 are employed as etching masks for etching the n-type GaN substrate 1 up to a depth of about 2 μm from the upper surface thereof by reactive ion etching (RIE) with $Cl_2$ gas. This etching is performed at an etching selectivity ratio (mask layer 17/n-type GaN substrate 1) of 1:10 under conditions of an etching pressure of about 3.325 kPa, plasma power of about 200 W and an etching rate of about 140 nm/sec. to about 150 nm/sec. Thus, striped (slender) groove portions 1a, each having a width W1 of about 50 μm and a depth D1 of about 2 μm, extending in the [1-100] direction are formed on the n-type GaN substrate 1. Under the aforementioned etching conditions, the side surfaces of the groove portions 1a are perpendicular to the upper surface of the n-type GaN substrate 1. In the n-type GaN substrate 1, regions 1b, each having the width W2 of about 200 μm in the [11-20] direction, held between the groove portions 1a correspond to light-emitting portions of a nitride-based semiconductor device layer 10 described later. The regions 1b of the n-type GaN substrate 1 are examples of the "first region" in the present invention, and regions of the n-type GaN substrate 1 formed with the groove portions 1a are examples of the "second region" in the present invention. Thereafter the mask layers 17 are removed.

Figure 5:
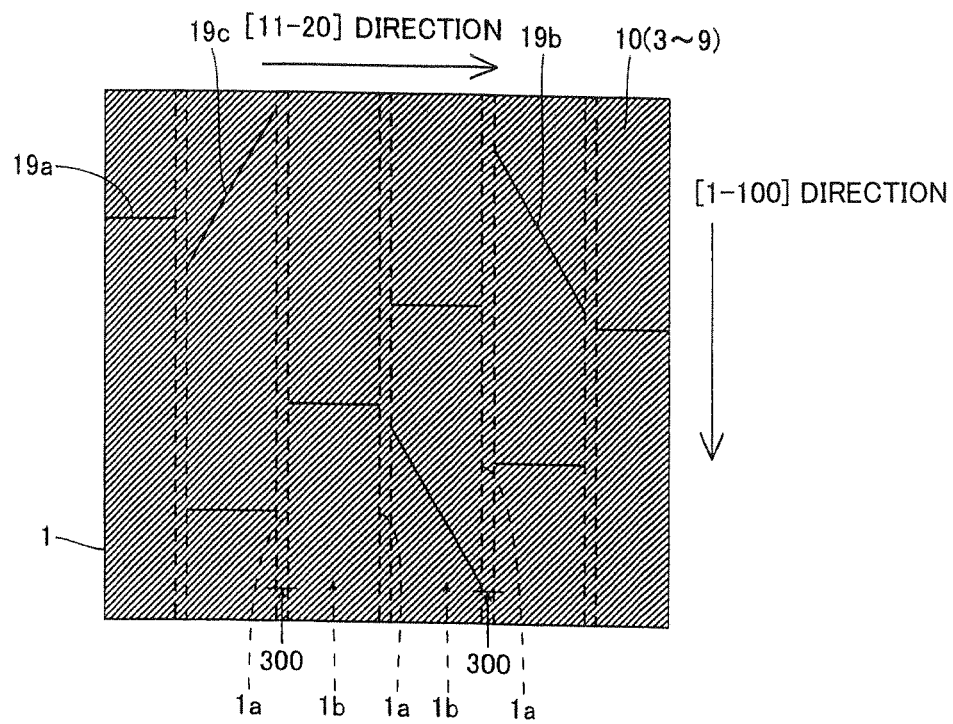
FIG. 5 is a plan view for illustrating the method of fabricating a nitride-based semiconductor laser diode according to the first embodiment of the present invention.
Figure 6:
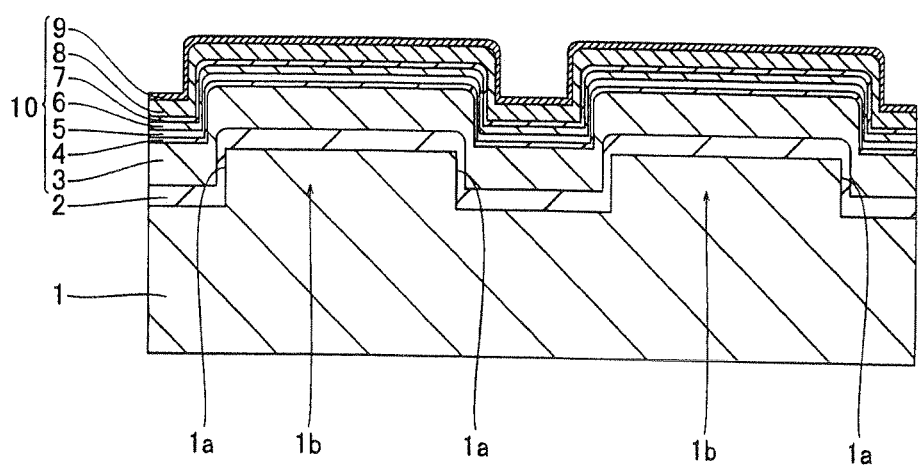
FIG. 6 is a sectional view taken along the line 300-300 in FIG. 5.

As shown in FIGS. 5 and 6, nitride-based semiconductor layers (3 to 9) constituting the nitride-based semiconductor device layer 10 are successively formed on the upper surfaces of the regions 1b of the n-type GaN substrate 1 and the bottom and side surfaces of the groove portions 1a by MOCVD through a buffer layer 2.

More specifically, the n-type GaN substrate 1 formed with the groove portions 1a is inserted into a reactor of a hydrogen-nitrogen atmosphere as shown in FIG. 6. Thereafter NH$_3$ gas employed as the nitrogen source for the nitride-based semiconductor layers (2 to 9) is supplied into the reactor, and the n-type GaN substrate 1 is heated up to a temperature of about 1160° C. When the n-type GaN substrate 1 reaches the temperature of about 1160° C., trimethylgallium (TMGa) gas and trimethylaluminum (TMAl) gas employed as Ga and Al sources respectively are supplied into the reactor with H$_2$ gas employed as carrier gas, thereby growing the buffer layer 2 of undoped Al$_{0.01}$Ga$_{0.99}$N having a thickness of about 0.8 μm on the n-type GaN substrate 1 at a growth rate of about 1.1 μm/h. Thereafter TMGa gas, TMAl gas and GeH$_4$ (monogerman) gas employed as a Ge source serving as an n-type impurity are supplied into the reactor with H$_2$ gas employed as carrier gas, thereby growing an n-type cladding layer 3 of n-type Al$_{0.07}$Ga$_{0.93}$N doped with Ge having a thickness of about 1.8 μm on the buffer layer 2 at a growth rate of about 1.1 μm/h. This n-type cladding layer 3 of n-type Al$_{0.07}$Ga$_{0.93}$N has a lattice constant of about 0.3184 nm (a-axis direction). The lattice constant of the n-type cladding layer 3 of n-type Al$_{0.07}$Ga$_{0.93}$N has been calculated on the basis of the lattice constants of GaN (about 0.3814 nm (a-axis direction)) and AlN (about 0.3112 nm (a-axis direction)). The n-type cladding layer 3 is an example of the "nitride-based semiconductor layer" in the present invention. Further, TMGa gas and TMAl gas are supplied into the reactor with H$_2$ gas employed as carrier gas, thereby growing an n-side carrier blocking layer 4 of undoped Al$_{0.2}$Ga$_{0.8}$N having a thickness of about 20 nm on the n-type cladding layer 3 at a growth rate of about 1 μm/h.

Then, the temperature of the n-type GaN substrate 1 is reduced from about 1160° C. to about 850° C. Triethylgallium (TEGa) gas and trimethylindium (TMIn) gas employed as Ga and In sources respectively are supplied into the reactor with H$_2$ gas employed as carrier gas, thereby alternately growing four barrier layers (not shown) of undoped In$_{0.02}$Ga$_{0.98}$N each having a thickness of about 20 nm and three quantum well layers (not shown) of undoped In$_{0.15}$Ga$_{0.85}$N each having a thickness of about 3.5 nm on the n-side carrier blocking layer 4 at a rate of about 0.25 μm/h. Thus, a multiple quantum well (MQW) active layer 5 is formed in an MQW structure obtained by alternately stacking the four barrier layers and the three quantum well layers with each other. Then, a p-side light guide layer 6 of undoped In$_{0.1}$Ga$_{0.99}$N having a thickness of about 0.1 μm is grown on the MQW active layer 5. Thereafter TMGa gas and TMAl gas are supplied into the reactor with N$_2$ gas employed as carrier gas, thereby growing a p-side carrier blocking layer 7 of undoped Al$_{0.2}$Ga$_{0.8}$N having a thickness of about 20 nm on the p-side light guide layer 6 at a growth rate of about 1.2 μm/h.

Then, the temperature of the n-type GaN substrate 1 is increased from about 850° C. to about 1000° C. Then, TMGa gas, TMAl gas and Mg(C$_5$H$_5$)$_2$ (cyclopentadienyl magnesium) employed as an Mg source serving as a p-type impurity are supplied into the reactor with N$_2$ gas employed as carrier gas, thereby growing a p-type cladding layer 8 of p-type Al$_{0.07}$Ga$_{0.93}$N doped with Mg having a thickness of about 0.45 μm on the p-side carrier blocking layer 7 at a growth rate of about 1.1 μm/h. Thereafter the temperature of the n-type GaN substrate 1 is reduced from about 1000° C. to about 850° C. Then, TEGa gas and TMIn gas are supplied into the reactor with N$_2$ gas employed as carrier gas, thereby growing a p-side contact layer 9 of undoped In$_{0.07}$Ga$_{0.93}$N having a thickness of about 3 nm on the p-type cladding layer 8 at a growth rate of about 0.25 μm/h. Thus, the nitride-based semiconductor device layer 10 constituted of the nitride-based semiconductor layers (3 to 9) is formed on the upper surfaces of the regions 1b of the n-type GaN substrate 1 and the bottom and side surfaces of the groove portions 1a through the buffer layer 2.

According to the first embodiment, the thicknesses of the portions of the nitride-based semiconductor layers (2 to 9) formed on the side surfaces of the groove portions 1a extending in the [1-100] direction (see FIG. 5) are smaller than those of the portions of the nitride-based semiconductor layers (2 to 9) formed on the regions 1b of the n-type GaN substrate 1 respectively. When the n-type cladding layer 3 is strained due to the difference between the lattice constant (about 0.3189 nm) of the n-type GaN substrate 1 and the lattice constant (about 0.3184 nm) of the n-type cladding layer 3 of n-type Al$_{0.07}$Ga$_{0.93}$N, therefore, this strain concentrates on the portions, having the smaller thickness, of the n-type cladding layer 3 located on the side surfaces of the groove portions 1a, whereby the strain caused on the portions of the n-type cladding layer 3 located on the regions 1b of the n-type GaN substrate 1 is relaxed. Thus, the quantity of cracks 19a to 19c formed on the nitride-based semiconductor device layer 10 including the n-type cladding layer 3 is inhibited from increase resulting from remarkable strain of the n-type cladding layer 3, as shown in FIG. 5. Therefore, the quantity of cracks 19a to 19c formed on the nitride-based semiconductor device layer 10 including the n-type cladding layer 3 is also inhibited from increase.

According to the first embodiment, the cracks 19a, 19b and 19c extending in the [11-20] direction, the [1-210] direction (see FIG. 34) and the [−2110] direction (see FIG. 34) respectively intersect with the regions corresponding to the groove portions 1a extending in the [1-100] direction, to be inhibited from propagation across the regions corresponding to the groove portions 1a.

Thereafter the n-type GaN substrate 1 formed with the nitride-based semiconductor device layer 10 is taken out from the reactor.

Figure 7:
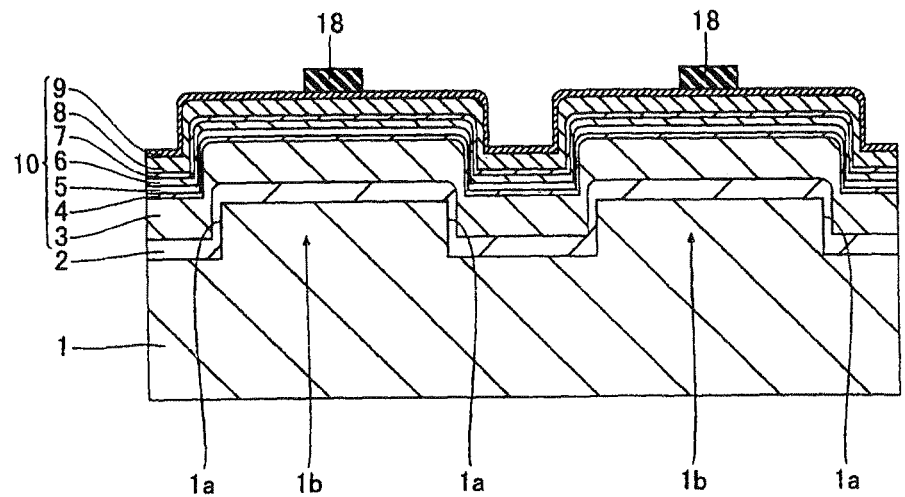
FIGS. 7 to 11 are sectional views for illustrating the method of fabricating a nitride-based semiconductor laser diode according to the first embodiment of the present invention.

As shown in FIG. 7, striped (slender) mask layers 18 of SiO$_2$ are formed on prescribed regions, corresponding to the regions 1b of the n-type GaN substrate 1, of the p-side contact layer 9 by plasma CVD. More specifically, the mask layers 18 are so formed as to extend in the [1-100] direction (see FIG. 5). Further, the mask layers 18 are set to a width of about 1.5 μm in the [11-20] direction (see FIG. 5).

Figure 8:
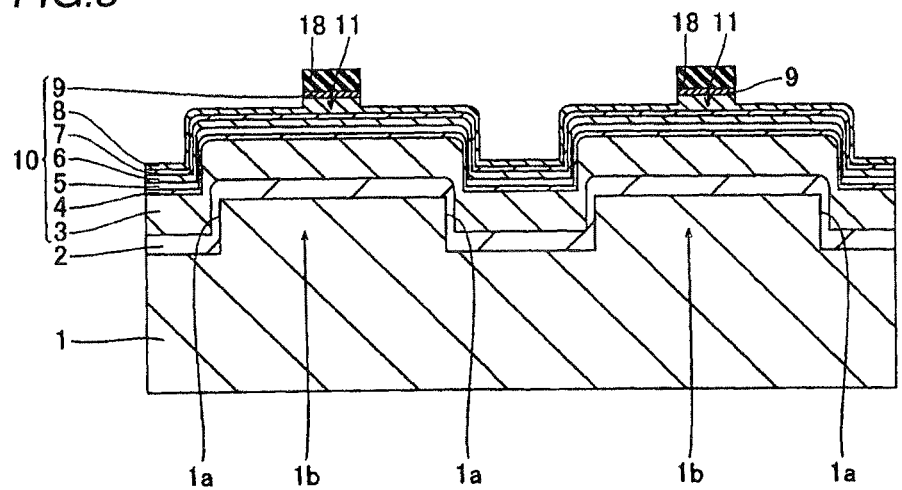

As shown in FIG. 8, the mask layers 18 are employed as etching masks for etching the p-side contact layer 9 and the p-type cladding layer 8 by a thickness of about 0.4 µm from the upper surfaces thereof by RIE with $Cl_4$ gas. Thus, striped (slender) ridge portions 11 are constituted of projecting portions of the p-type cladding layer 8 and the p-side contact layer 9 to extend in the [1-100] direction (see FIG. 5). The ridge portions 11 are formed to have a width of about 1.5 µm in the [11-20] direction (see FIG. 5) and a protrusion height of about 0.402 µm. These ridge portions 11 function as current paths, and portions located under the ridge portions 11 form light-emitting portions. The remaining planar portions of the p-type cladding layer 8 other than the projecting portions have a thickness of about 0.05 µm. Thereafter the mask layers 18 are removed.

Figure 9:
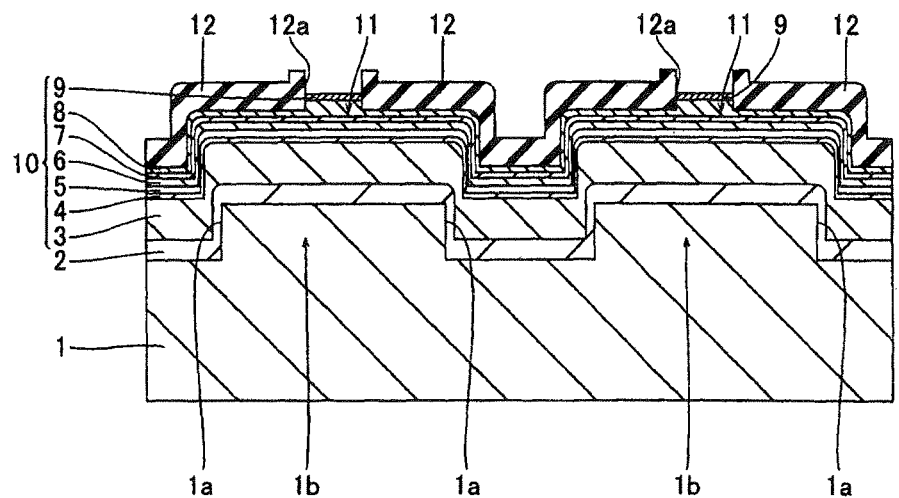

As shown in FIG. 9, an $SiO_2$ film having a thickness of about 0.2 µm is formed on the overall surface by plasma CVD, and regions of the $SiO_2$ film corresponding to the ridge portions 11 are removed, thereby forming a current blocking layer 12 having openings 12a in the regions corresponding to the ridge portions 11 respectively.

Figure 10:
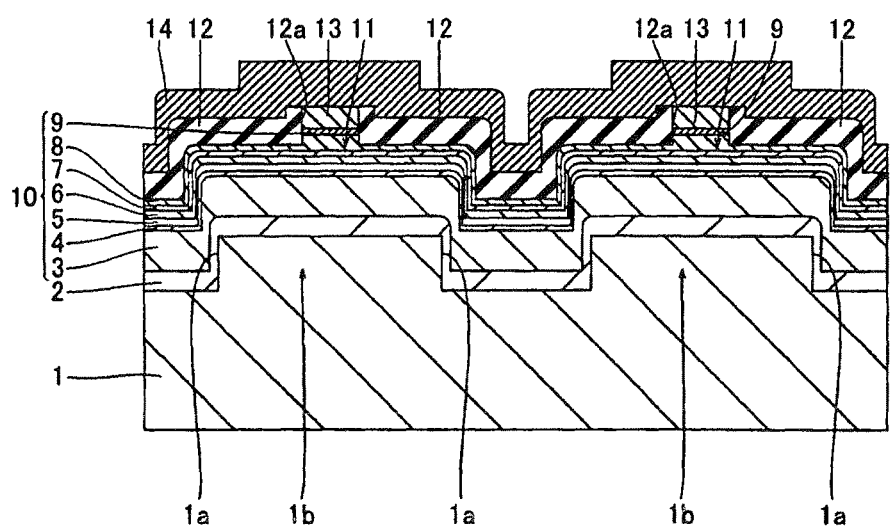

As shown in FIG. 10, p-side ohmic electrodes 13 are formed on the portions of the p-side contact layer 9 constituting the ridge portions 11 by electron beam evaporation. In order to form the p-side ohmic electrodes 13, Pt layers having a thickness of about 1 nm and Pd layers having a thickness of about 10 nm are successively formed in ascending order. Thereafter a p-side pad electrode 14 is formed on the current blocking layer 12 by electron beam evaporation, to be in contact with the upper surfaces of the p-side ohmic electrodes 13. In order to form the p-side pad electrode 14, a Ti layer having a thickness of about 30 nm, a Pd layer having a thickness of about 150 nm and an Au layer having a thickness of about 3 µm are successively formed in ascending order.

Figure 11:
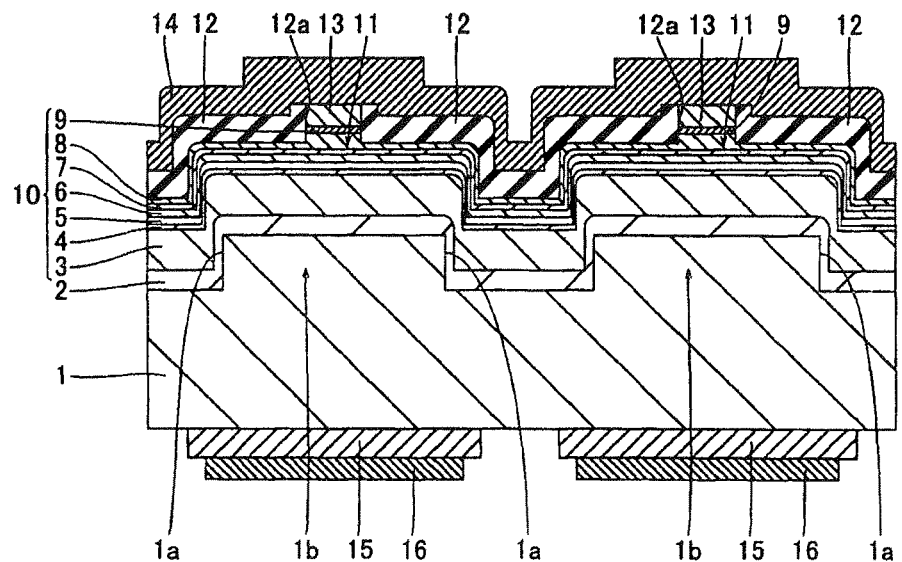

As shown in FIG. 11, the back surface of the n-type GaN substrate 1 is polished up to a thickness facilitating cleavage in a cleaving step described later. Thereafter n-side ohmic electrodes 15 and n-side pad electrodes 16 of Au having a thickness of about 300 nm are successively formed on prescribed regions of the back surface of the n-type GaN substrate 1 by electron beam evaporation. In order to form the n-side ohmic electrodes 15, Al layers having a thickness of about 6 nm and Pd layers having a thickness of about 10 nm are successively formed from the side closer to the back surface of the n-type GaN substrate 1.

Figure 12:
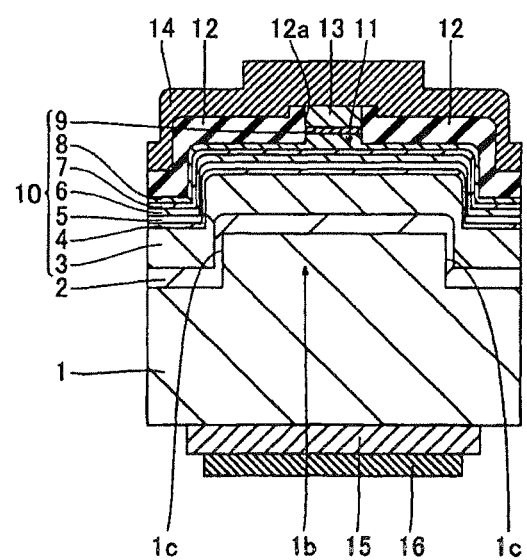
FIG. 12 is a sectional view showing the structure of a nitride-based semiconductor laser diode formed through the method of fabricating a nitride-based semiconductor laser diode according to the first embodiment of the present invention.

Finally, the structure shown in FIG. 11 is separated into the respective devices in the [1-100] direction (see FIG. 5) along the centers of the groove portions 1a of the n-type GaN substrate 1 and the devices are cleaved into chips in the [11-20] direction (see FIG. 5), thereby forming a nitride-based semiconductor laser diode according to the first embodiment shown in FIG. 12.

In the nitride-based semiconductor laser diode formed through the fabrication method according to the first embodiment, the groove portion 1a (see FIG. 11) of the n-type GaN substrate 1 forms a step portion 1c having a vertical side surface through the aforementioned separation step, as shown in FIG. 12. In other words, the thicknesses of the portions of the nitride-based semiconductor layers (2 to 9) formed on the side surface of the step portion 1c of the n-type GaN substrate 1 are smaller than those of the portions of the nitride-based semiconductor layers (2 to 9) formed on the region 1b of the n-type GaN substrate 1 respectively in the nitride-based semiconductor laser diode formed through the fabrication method according to the first embodiment.

According to the first embodiment, as hereinabove described, the thickness of the portions of the n-type cladding layer 3 of n-type $Al_{0.07}Ga_{0.93}N$ formed on the side surfaces of the groove portions 1a is rendered smaller than that of the portions of the n-type cladding layer 3 formed on the regions 1b of the n-type GaN substrate 1 when the nitride-based semiconductor device layer 10 is formed on the n-type GaN substrate 1 through the buffer layer 2 so that strain concentrates on the portions, having the smaller thickness, of the n-type cladding layer 3 located on the side surfaces of the groove portions 1a when the n-type cladding layer 3 is strained due to the difference between the lattice constant (about 0.3189 nm) of the n-type GaN substrate 1 and the lattice constant (about 0.3184 nm) of the n-type cladding layer 3 of n-type $Al_{0.07}Ga_{0.93}N$, whereby the strain can be relaxed on the portions of the n-type cladding layer 3 located on the regions 1b of the n-type GaN substrate 1. Thus, the quantity of the cracks 19a to 19c formed on the n-type cladding layer 3 can be inhibited from increase resulting from remarkable strain of the n-type cladding layer 3. Therefore, the quantity of cracks 19a to 19c formed on the nitride-based semiconductor device layer 10 including the n-type cladding layer 3 can also be inhibited from increase, whereby the cracks 19a to 19c can be inhibited from increasing a leakage current not supplied to the light-emitting portions of the nitride-semiconductor device layer 10 and hindering a transmission of a light. Consequently, the nitride-based semiconductor laser diode can be inhibited from reduction of characteristics and a yield.

According to the first embodiment, the groove portions 1a are formed on the n-type GaN substrate 1 with the side surfaces perpendicular to the upper surface of the n-type GaN substrate 1 so that the material (AlGaN) constituting the n-type cladding layer 3 formed on the n-type GaN substrate 1 through the buffer layer 2 is hardly deposited on the side surfaces of the groove portions 1a, whereby the thickness of the portions of the n-type cladding layer 3 formed on the side surfaces of the groove portions 1a can be easily reduced below that of the portions of the n-type cladding layer 3 formed on the regions 1b of the n-type GaN substrate 1.

According to the first embodiment, the groove portions 1a are formed on the n-type GaN substrate 1 to extend in the [1-100] direction so that the cracks 19a, 19b and 19c extending in the [11-20] direction, the [1-210] direction and the [-2110] direction respectively intersect with the regions corresponding to the groove portions 1a extending in the [1-100] direction, to be inhibited from propagation across the regions corresponding to the groove portions 1a.

(Second Embodiment)

Referring to FIGS. 13 to 15 and 34, striped (slender) groove portions 21a extending in the [11-20] direction are formed on an n-type GaN substrate 21 in a method of fabricating a nitride-based semiconductor laser diode according to a second embodiment of the present invention, dissimilarly to the aforementioned first embodiment.

Figure 13:
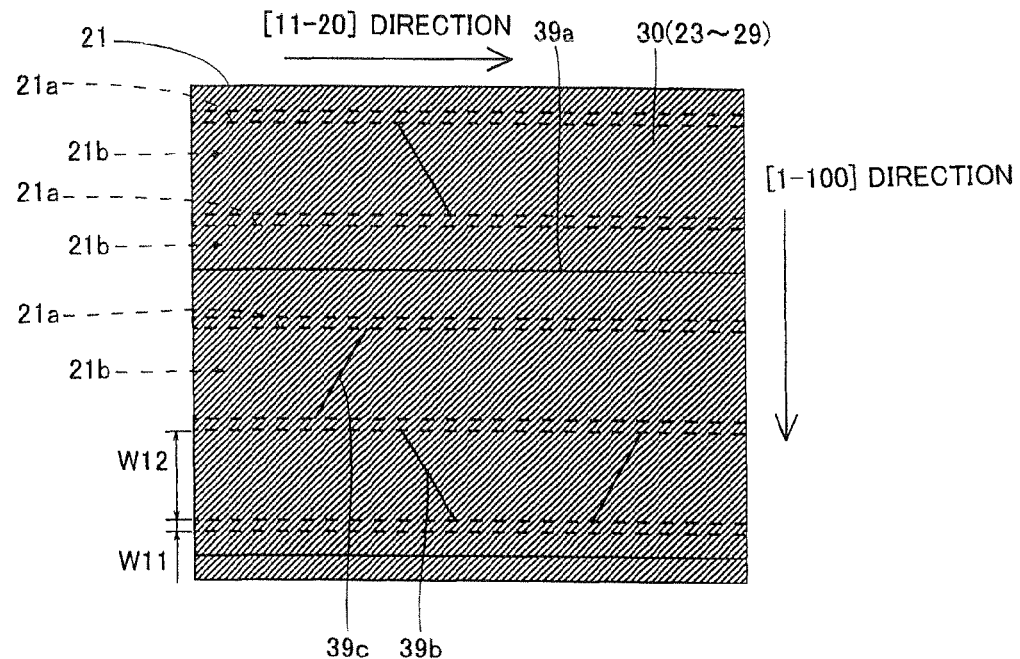
FIG. 13 is a plan view for illustrating a method of fabricating a nitride-based semiconductor laser diode according to a second embodiment of the present invention.

In the method of fabricating a nitride-based semiconductor laser diode according to the second embodiment, the striped (slender) groove portions 21a each having a width W11 of about 50 µm and a depth of about 2 µm with side surfaces perpendicular to the upper surface of the n-type GaN substrate 21 are formed on the n-type GaN substrate 21 through steps similar to those in the first embodiment shown in FIGS. 1 to 4, as shown in FIG. 13. According to the second embodiment, however, the groove portions 21a are so formed as to extend in the [11-20] direction. The distance W12 between the groove portions 21a adjacent to each other along the [1-100] direction is set larger than the distance (cavity length) between cleavage planes formed in a cleaving step described later. Regions 21b of the n-type GaN substrate 21 held between the groove portions 21a correspond to light-emitting portions of a nitride-based semiconductor device layer 30 described later. The n-type GaN substrate 21 is an example of the "nitride-based semiconductor substrate" in the present invention. The regions 21b of the n-type GaN substrate 21 are examples of the "first region" in the present invention, and the regions of the n-type GaN substrate 21 formed with the groove portions 21a are examples of the "second region" in the present invention.

According to the second embodiment, the n-type GaN substrate 21 has a surface of the (0001) plane with a low dislocation density, similarly to the n-type GaN substrate 1 in the aforementioned first embodiment. Further, the n-type GaN substrate 21 has a lattice constant of about 0.3189 nm.

Thereafter the nitride-based semiconductor device layer 30 is formed on the upper surfaces of the regions 21b of the n-type GaN substrate 21 and the bottom and side surfaces of the groove portions 21a through a buffer layer 22 through a step similar to that of the first embodiment shown in FIG. 6. At this time, the buffer layer 22, an n-type cladding layer 23, an n-side carrier blocking layer 24, an MQW active layer 25, a p-side light guide layer 26, a p-side carrier blocking layer 27, a p-type cladding layer 28 and a p-side contact layer 29 are successively formed from the side closer to the n-type GaN substrate 21. These layers (22 to 29) are formed to have the same thicknesses and compositions as those of the nitride-based semiconductor layers (2 to 9) in the aforementioned first embodiment. In other words, the n-type cladding layer 23 formed on the n-type GaN substrate 21 through the buffer layer 22 is constituted of n-type $Al_{0.07}Ga_{0.93}N$ with a lattice constant of about 0.3184 nm. The n-type cladding layer 23 is an example of the "nitride-based semiconductor layer" in the present invention.

According to the second embodiment, portions of the nitride-based semiconductor layers (22 to 29) formed on the side surfaces of the groove portions 21a extending in the [11-20] direction are smaller than those of portions of the nitride-based semiconductor layers (22 to 29) formed on the regions 21b of the n-type GaN substrate 21 respectively, similarly to the aforementioned first embodiment. Therefore, strain caused on the n-type cladding layer 23 concentrates on the portions, having the smaller thickness, of the n-type cladding layer 23 located on the side surfaces of the groove portions 21a, whereby the portions of the n-type cladding layer 23 located on the regions 21b of the n-type GaN substrate 21 are less strained. Thus, the quantity of cracks 39a to 39c formed on the n-type cladding layer 23 is inhibited from increase, while the quantity of cracks 39a to 39c formed on the nitride-based semiconductor device layer 30 including the n-type cladding layer 23 is also inhibited from increase.

According to the second embodiment, the cracks 39b and 39c extending in the [1-210] direction (see FIG. 34) and the [-2110] direction (see FIG. 34) respectively intersect with the groove portions 21a extending in the [11-20] direction, to be inhibited from propagation across the regions corresponding to the groove portions 21a.

Figure 14:
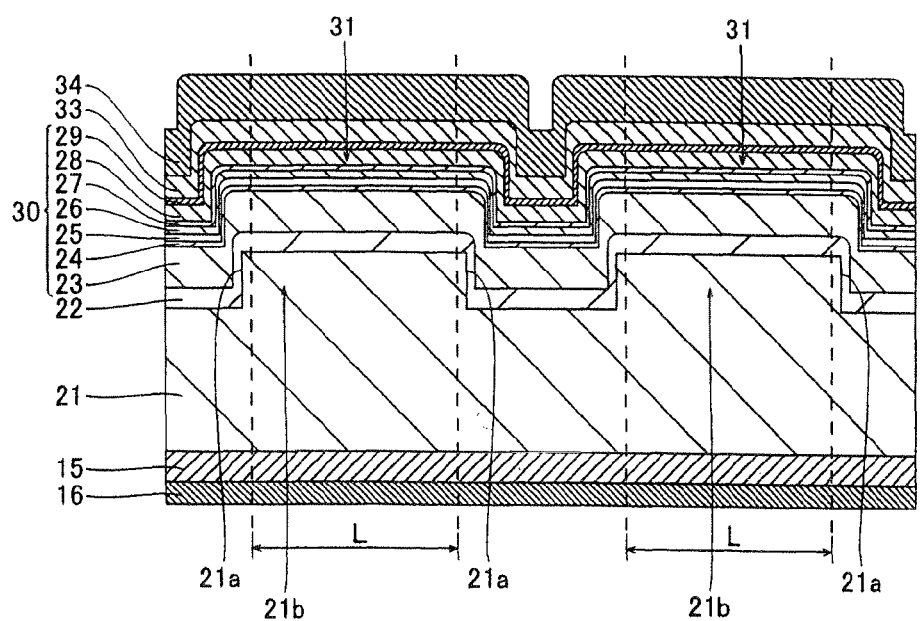
FIG. 14 is a sectional view for illustrating the method of fabricating a semiconductor laser diode according to the second embodiment of the present invention.

As shown in FIG. 14, ridge portions 31 extending in the [1-100] direction (see FIG. 13) are formed through steps similar to those of the first embodiment shown in FIGS. 7 to 11, followed by successive formation of a current blocking layer 32 (see FIG. 15) having openings 32a, p-side ohmic electrodes 33 and p-side pad electrodes 34. Further, an n-side ohmic electrode 15 and an n-side pad electrode 16 are successively formed on a prescribed region of the back surface of the n-type GaN substrate 21. FIG. 14 is a sectional view taken along a line extending in the [1-100] direction. According to the second embodiment, the ridge portions 13 extending in the [1-100] direction intersect with the groove portions 21a formed to extend in the [11-20] direction (see FIG. 13). The ridge portions 31 function as current paths, and portions located under the ridge portions 31 form light-emitting portions. The current blocking layer 32, the p-side ohmic electrodes 33 and the p-side pad electrodes 34 are formed to have the same thicknesses and compositions as the current blocking layer 12, the p-side ohmic electrodes 13 and the p-side pad electrodes 14 in the aforementioned first embodiment.

Thereafter the structure shown in FIG. 14 is separated into the respective devices in the [1-100] direction (see FIG. 13) and the devices are cleaved into chips in the [11-20] direction (see FIG. 13). At this time, prescribed regions (shown by broken lines in FIG. 14) corresponding to the regions 21b of the n-type GaN substrate 21 are cleaved along the [11-20] direction so that the distance (cavity length L in FIG. 14) between the cleavage planes of the chips is smaller than the distance W12 (see FIG. 13) between the groove portions 21a. Thus, a nitride-based semiconductor laser diode is formed according to the second embodiment, as shown in FIG. 15.

Figure 15:
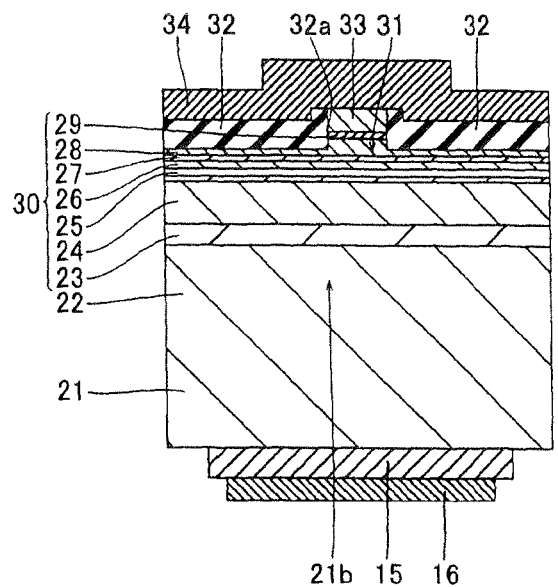
FIG. 15 is a sectional view showing the structure of a nitride-based semiconductor laser diode formed through the method of fabricating a semiconductor laser diode according to the second embodiment of the present invention.

As shown in FIG. 15, a portion corresponding to each groove portion 21a has been entirely removed through the aforementioned cleaving step in the nitride-based semiconductor laser diode formed according to the method of the second embodiment. In the nitride-based semiconductor laser diode formed according to the method of the second embodiment, therefore, the n-type GaN substrate 21 has no step portion, dissimilarly to the nitride-based semiconductor laser diode formed according to the method of the aforementioned first embodiment.

According to the second embodiment, as hereinabove described, the thickness of the portions of the n-type cladding layer 23 of n-type $Al_{0.07}Ga_{0.93}N$ formed on the side surfaces of the groove portions 21a is rendered smaller than that of the portions of the n-type cladding layer 23 formed on the regions 21b of the n-type GaN substrate 21 when the nitride-based semiconductor device layer 30 is formed on the n-type GaN substrate 21 through the buffer layer 22 so that strain concentrates on the portions, having the smaller thickness, of the n-type cladding layer 23 located on the side surfaces of the groove portions 21a similarly to the aforementioned first embodiment, whereby the quantity of the cracks 39a to 39c formed on the portions of the n-type cladding layer 23 located on the regions 21b of the n-type GaN substrate 21 can be inhibited from increase while the quantity of cracks 39a to 39c formed on the nitride-based semiconductor layer 30 including the n-type cladding layer 23 can also be inhibited from increase. Consequently, the cracks 39a to 39,c can be inhibited from increasing a leakage current and hindering a transmission of a light similarly to the aforementioned first embodiment, whereby the nitride-based semiconductor laser diode can be inhibited from reduction of characteristics and a yield.

According to the second embodiment, the groove portions 21a are formed on the n-type GaN substrate 21 to extend in the [11-20] direction so that the cracks 39b and 39c extending in the [1-210] direction and the [-2110] direction respectively intersect with the regions corresponding to the groove portions 21a extending in the [11-20] direction, to be inhibited from propagation across the regions corresponding to the groove portions 21a.

The remaining effects of the second embodiment are similar to those of the aforementioned first embodiment.

(Third Embodiment)

Figure 16:
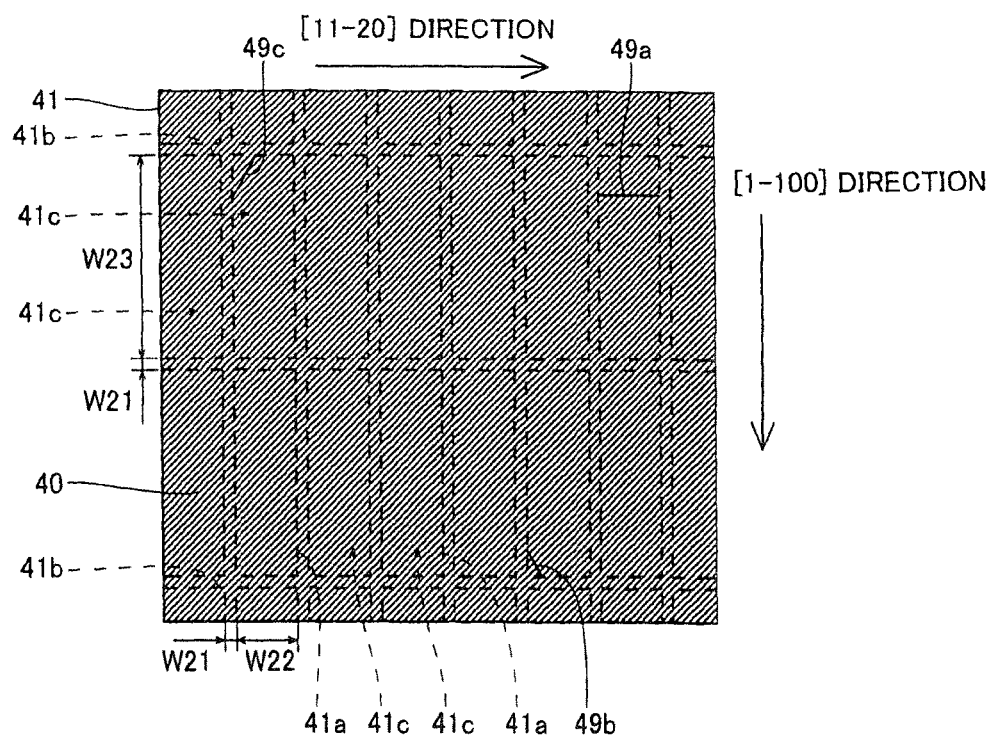
FIG. 16 is a plan view for illustrating a method of fabricating a nitride-based semiconductor laser diode according to a third embodiment of the present invention.
Figure 34:
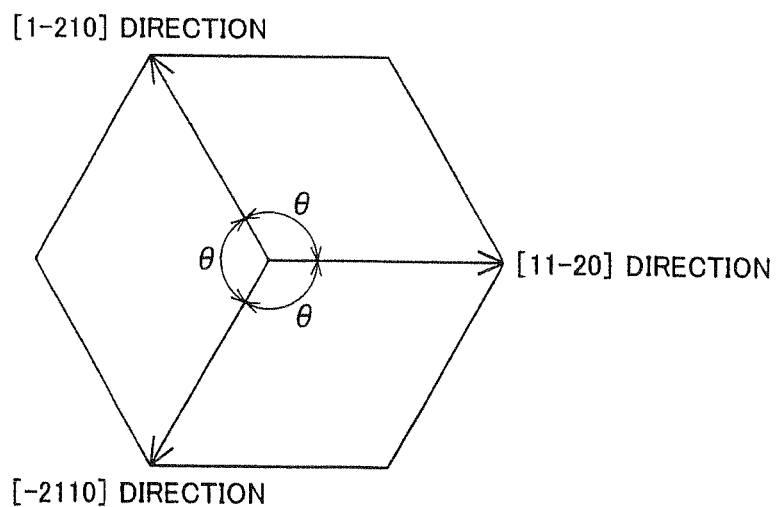
FIG. 34 is a model diagram showing the crystal orientation of a hexagonal GaN substrate.

Referring to FIGS. 16 and 34, striped (slender) groove portions 41a and 41b extending in the [1-100] direction and the [11-20] direction respectively are latticed on an n-type GaN substrate 41 in a method of fabricating a nitride-based semiconductor laser diode according to a third embodiment of the present invention, dissimilarly to the aforementioned first and second embodiments.

In the method of fabricating a nitride-based semiconductor laser diode according to the third embodiment, the striped (slender) groove portions 41a and 41b each having a width W21 of about 50 μm and a depth of about 2 μm with side surfaces perpendicular to the upper surface of the n-type GaN substrate 41 are formed on the n-type GaN substrate 41 through steps similar to those of the first embodiment shown in FIGS. 1 to 4, as shown in FIG. 16. According to the third embodiment, however, the groove portions 41a and 41b are so latticed as to extend in the [1-100] direction and the [11-20] direction respectively. The distance W22 between the groove portions 41a adjacent to each other in the [11-20] direction is set to about 200 μm. Further, the distance W23 between the groove portions 41b adjacent to each other in the [1-100] direction is set larger than the distance (cavity length) between cleavage planes formed in a cleaving step described later. Regions 41b of the n-type GaN substrate 41 held between the groove portions 41a and 41b correspond to light-emitting portions located under ridge portions (not shown) of a nitride-based semiconductor device layer 40 described later. The n-type GaN substrate 41 is an example of the "nitride-based semiconductor substrate" in the present invention. The regions 41c of the n-type GaN substrate 41 are examples of the "first region" in the present invention, and the regions of the n-type GaN substrate 41 formed with the groove portions 41a and 41b are examples of the "second region" in the present invention.

According to the third embodiment, the n-type GaN substrate 41 has a surface of the (0001) plane with a low dislocation density, similarly to the n-type GaN substrate 1 in the aforementioned first embodiment. Further, the n-type GaN substrate 41 has a lattice constant of about 0.3189 nm.

Thereafter the nitride-based semiconductor device layer 40 is formed on the upper surfaces of the regions 41c of the n-type GaN substrate 41 and the bottom and side surfaces of the groove portions 41a and 41b through a buffer layer (not shown) through a step similar to that of the first embodiment shown in FIG. 6. The nitride-based semiconductor device layer 40 is formed to have the same structure as the nitride-based semiconductor device layer 10 in the aforementioned first embodiment. In other words, the nitride-based semiconductor device layer 40 formed according to the method of the third embodiment includes an n-type cladding layer (not shown) formed on the n-type GaN substrate 41 through the buffer layer (not shown). The n-type cladding layer constituting the nitride-based semiconductor device layer 40 consists of n-type $Al_{0.07}Ga_{0.93}N$ with a lattice constant of about 0.3184 nm.

According to the third embodiment, the thicknesses of portions of the nitride-based semiconductor layers formed on the side surfaces of the groove portions 41a and 41b extending in the [1-100] direction and the [11-20] direction respectively are smaller than those of portions of the nitride-based semiconductor layers formed on the regions 41c of the n-type GaN substrate 41 respectively, similarly to the aforementioned first embodiment. Therefore, strain caused on the n-type cladding layer (not shown) constituting the nitride-based semiconductor device layer 40 concentrates on the portions, having the smaller thickness, of the n-type cladding layer (not shown) located on the side surfaces of the groove portions 41a and 41b respectively, whereby the portions of the n-type cladding layer (not shown) located on the regions 41c of the n-type GaN substrate 41 are less strained. Thus, the quantity of cracks 49a to 49c formed on the n-type cladding layer (not shown) is inhibited from increase, while the quantity of cracks 49a to 49c formed on the nitride-based semiconductor device layer 40 including the n-type cladding layer (not shown) is also inhibited from increase.

According to the third embodiment, the cracks 49a, 49b and 49c extending in the [11-20] direction, the [1-210] direction (see FIG. 34) and the [-2110] direction (see FIG. 34) respectively intersect with regions corresponding to the groove portions 41a extending in the [1-100] direction, to be inhibited from propagation across the regions corresponding to the groove portions 41a.

Further, the cracks 49b and 49c extending in the [1-210] direction and the [-2110] direction respectively also intersect with regions corresponding to the groove portions 41b extending in the [11-20] direction, to be inhibited from propagation across the regions corresponding to the groove portions 41b.

The remaining steps of the fabrication method according to the third embodiment are similar to those of the aforementioned first embodiment. In other words, ridge portions (not shown) extending in the [1-100] direction identically to the groove portions 41a perpendicularly to the groove portions 41b extending in the [11-20] direction are formed on the nitride-based semiconductor device layer 40 in the method according to the third embodiment.

According to the third embodiment, as hereinabove described, the thickness of the portions of the n-type cladding layer (not shown) of n-type $Al_{0.07}Ga_{0.93}N$ formed on the side surfaces of the groove portions 41a and 41b respectively is rendered smaller than that of the portions of the n-type cladding layer (not shown) formed on the regions 41c of the n-type GaN substrate 41 when the nitride-based semiconductor device layer 40 is formed on the n-type GaN substrate 41 through the buffer layer (not shown) so that strain concentrates on the portions, having the smaller thickness, of the n-type cladding layer (not shown) located on the side surfaces of the groove portions 41a and 41b respectively similarly to the aforementioned first embodiment, whereby the quantity of the cracks 49a to 49c formed on the portions of the n-type cladding layer located on the regions 41c of the n-type GaN substrate 41 can be inhibited from increase while the quantity of cracks 49a to 49c formed on the nitride-based semiconductor layer 40 including the n-type cladding layer can also be inhibited from increase. Consequently, the cracks 49a to 49c can be inhibited from increasing a leakage current and hindering a transmission of a light similarly to the aforementioned first embodiment, whereby the nitride-based semiconductor laser diode can be inhibited from reduction of characteristics and a yield.

According to the third embodiment, the striped (slender) groove portions 41a and 41b extending in the [1-100] direction and the [11-20] direction respectively are latticed on the n-type GaN substrate 41 so that the cracks 49a, 49b and 49c extending in the [11-20] direction, the [1-210] direction and the [-2110] direction respectively intersect with the regions corresponding to the groove portions 41a extending in the [1-100] direction, to be inhibited from propagation across the regions corresponding to the groove portions 41a. Further, the cracks 49b and 49c extending in the [1-210] direction and the [-2110] direction respectively also intersect with regions corresponding to the groove portions 41b extending in the [11-20] direction, to be inhibited from propagation across the regions corresponding to the groove portions 41b.

The remaining effects of the third embodiment are similar to those of the aforementioned first embodiment.

(Fourth Embodiment)

Referring to FIGS. 17 to 20 and 34, the opening width of each groove portion 51a formed on an n-type GaN substrate 51 is gradually increased from the bottom surface toward the opening end of the groove portion 51a in a method of fabricating a nitride-based semiconductor laser diode according to a fourth embodiment of the preset invention, dissimilarly to the aforementioned first to third embodiments.

Figure 17:
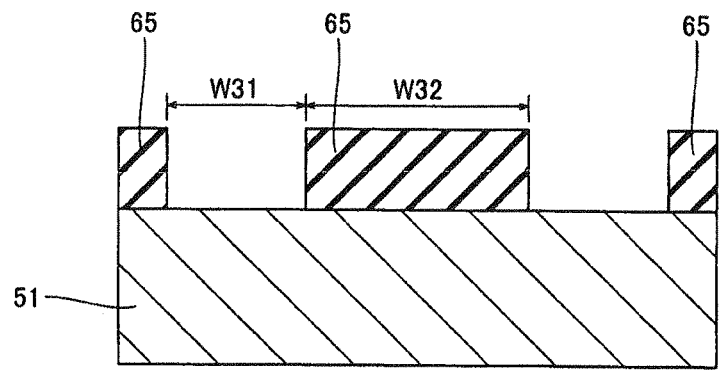
FIGS. 17 to 19 are sectional views for illustrating a method of fabricating a nitride-based semiconductor laser diode according to a fourth embodiment of the present invention.

In the method of fabricating a nitride-based semiconductor laser diode according to the fourth embodiment, the n-type GaN substrate 51 having a surface of the (0001) plane with a low dislocation density is prepared as shown in FIG. 17. This n-type GaN substrate 51 has a lattice constant of about 0.3189 nm. The n-type GaN substrate 51 is an example of the "nitride-based semiconductor substrate" in the present invention. Then, striped (slender) mask layers 65 of $SiO_2$ having a thickness of about 0.5 μm are formed on prescribed regions of the n-type GaN substrate 51 by plasma CVD. More specifically, the mask layers 65 are so formed as to extend in a prescribed direction ([1-100] direction, for example). The distance W31 between the mask layers 65 adjacent to each other are set to about 50 μm, while the width W32 of the mask layers 65 is set to about 200 μm.

Figure 18:
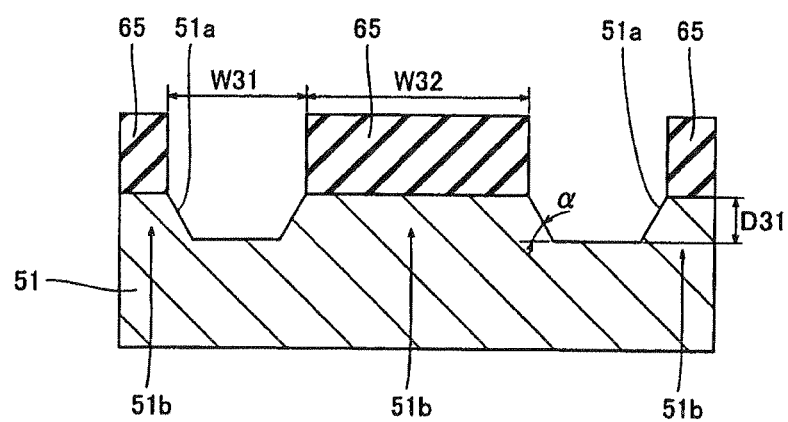

As shown in FIG. 18, the mask layers 65 are employed as etching masks for etching the n-type GaN substrate 51 up to a depth of about 2 μm from the upper surface thereof by RIE with $Cl_2$ gas. This etching is performed at an etching selectivity ratio (mask layer 65/n-type GaN substrate 51) of 1:10 under conditions of an etching pressure of about 3.325 kPa, plasma power of about 200 W and an etching rate of about 140 nm/sec. to about 150 nm/sec. Thus, striped (slender) groove portions 51a, each having a width (opening end width) W31 of about 50 μm and a depth D31 of about 2 μm, extending in the prescribed direction ([1-100] direction) are formed on the n-type GaN substrate 51. When the n-type GaN substrate 51 is etched through the mask layers 65 of $SiO_2$ serving as the etching masks under the aforementioned etching conditions, each groove portion 51a exhibits a mesa sectional shape. In other words, the opening width of the groove portion 51a is gradually increased from the bottom surface toward the opening end of the groove portion 51a. More specifically, the bottom surface and the side surface of the groove portion 51a form an angle α of about 40°. In the n-type GaN substrate 51, regions 51b, having a width W32 of about 200 μm, held between the groove portions 51a correspond to light-emitting portions of a nitride-based semiconductor device layer 60 described later. The regions 51b of the n-type GaN substrate 51 are examples of the "first region" in the present invention, and the regions of the n-type GaN substrate 51 formed with the groove portions 51a are examples of the "second region" in the present invention. Thereafter the mask layers 65 are removed.

Figure 19:
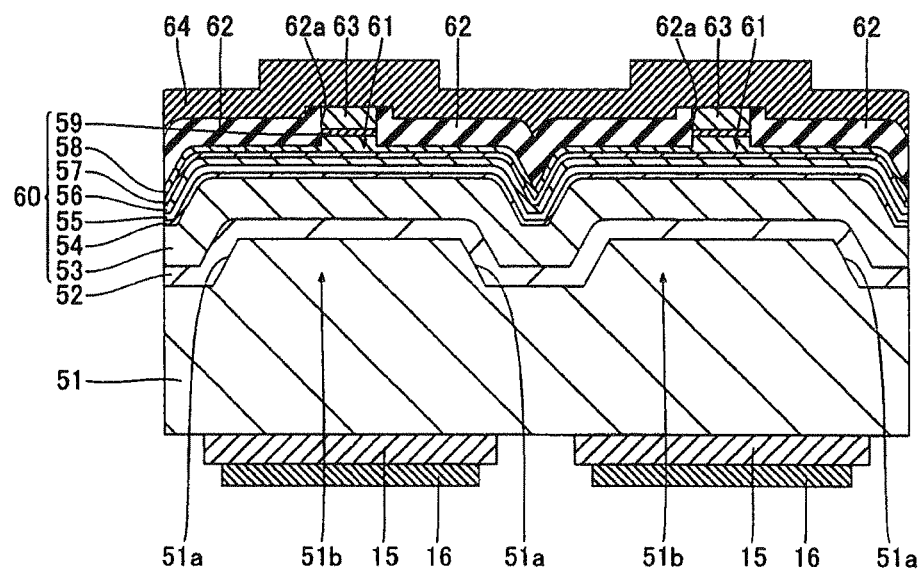

As shown in FIG. 19, the nitride-based semiconductor device layer 60 is formed on the upper surfaces of the regions 51b of the n-type GaN substrate 51 and the bottom and side surfaces of the groove portions 51a through a buffer layer 52, through a step similar to that of the first embodiment shown in FIG. 6. At this time, the buffer layer 52, anon-type cladding layer 53, an n-side carrier blocking layer 54, an MQW active layer 55, a p-side light guide layer 56, a p-side carrier blocking layer 57, a p-type cladding layer 58 and a p-side contact layer 59 are successively formed from the side closer to the n-type GaN substrate 51. These layers (52 to 59) are formed to have the same thicknesses and compositions as those of the nitride-based semiconductor layers (2 to 9) in the aforementioned first embodiment. In other words, the n-type cladding layer 53 formed on the n-type GaN substrate 51 through the buffer layer 52 is constituted of n-type $Al_{0.07}Ga_{0.93}N$ with a lattice constant of about 0.3184 nm. The n-type cladding layer 53 is an example of the "nitride-based semiconductor layer" in the present invention.

According to the fourth embodiment, Ga which is one of the constituents of the n-type cladding layer 53 conceivably easily moves toward the inclined side surfaces of the groove portions 51a when the n-type cladding layer 53 of n-type $Al_{0.07}Ga_{0.93}N$ is formed on the n-type GaN substrate 51 through the buffer layer 52, due to the mesa sectional shape of the groove portions 51a. Therefore, the Al composition ratio of portions of the n-type cladding layer 53 formed on the side surfaces of the groove portions 51a is reduced below the Al composition ratio of portions of the n-type cladding layer 53 formed on the regions 51b of the n-type GaN substrate 51. More specifically, the Al composition ratio of the portions of the n-type cladding layer 53 formed on the regions 51b of the n-type GaN substrate 51 is about 7%, while the Al composition ratio of the portions of the n-type cladding layer 53 formed on the side surfaces of the groove portions 51a is about 6.6%. In this case, the lattice constant of the portions, having the lower Al composition ratio, of the n-type cladding layer 53 formed on the side surfaces of the groove portions 51a approaches the lattice constant of the n-type GaN substrate 51, whereby the difference between the lattice constants of the n-type GaN substrate 51 and the n-type cladding layer 53 is reduced on the portions, having the lower Al composition ratio, of the n-type cladding layer 53 located on the side surfaces of the groove portions 51a. Also when the n-type cladding layer 53 is strained due to the difference between the lattice constants of the n-type GaN substrate 51 (lattice constant: about 0.3189 nm) and the n-type cladding layer 53 (lattice constant: about 0.3184 nm) of n-type $Al_{0.07}Ga_{0.93}N$, therefore, the strain is relaxed on the portions, having the lower Al composition ratio, of the n-type cladding layer 53 located on the side surfaces of the groove portions 51a, whereby the strain caused on the n-type cladding layer 53 is reduced. Thus, the quantity of cracks formed on the n-type cladding layer 53 is inhibited from increase, and the quantity of cracks formed on the nitride-based semiconductor device layer 60 including the n-type cladding layer 53 is also inhibited from increase.

Thereafter ridge portions 61 extending in the [1-100] direction (see FIG. 34) is formed through steps similar to those of the first embodiment shown in FIGS. 7 to 11, followed by successive formation of a current blocking layer 62 having openings 62a, p-side ohmic electrodes 63 and p-side pad electrodes 64. Further, n-side ohmic electrodes 15 and n-side pad electrodes 16 are successively formed on prescribed regions of the back surface of the n-type GaN substrate 51. According to the fourth embodiment, the groove portions 51a extend in the [1-100] direction (see FIG. 34), whereby the ridge portions 61 also extending in the [1-100] direction do not intersect with the groove portions 51a. These ridge portions 61 function as current paths, and portions located under the ridge portions 61 form light-emitting portions. The current blocking layer 62, the p-side ohmic electrodes 63 and the p-side pad electrodes 64 are formed to have the same thicknesses and compositions as the current blocking layer 12, the p-side ohmic electrodes 13 and the p-side pad electrodes 14 in the aforementioned first embodiment respectively.

Figure 20:
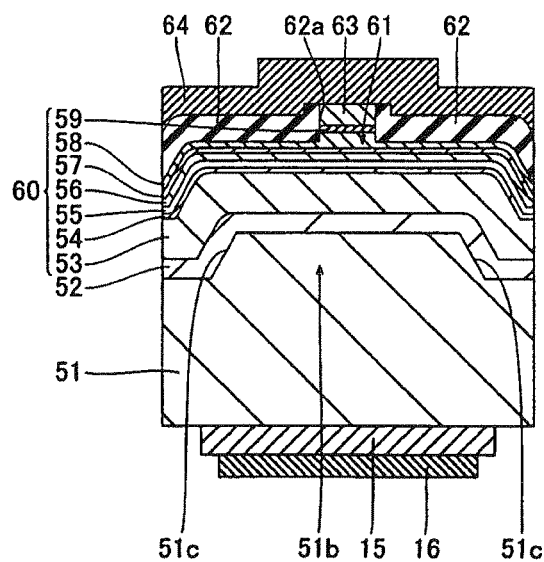
FIG. 20 is a sectional view showing the structure of a nitride-based semiconductor laser diode formed through the method of fabricating a nitride-based semiconductor laser diode according to the fourth embodiment of the present invention.

Thereafter the nitride-based semiconductor laser diode is formed according to the fourth embodiment as shown in FIG. 20, by performing separation and cleavage steps similar to those in the aforementioned first embodiment.

In the nitride-based semiconductor laser diode formed according to the method of the fourth embodiment, the groove portion 51a (see FIG. 19) of the n-type GaN substrate 51 forms a step portion sic having an inclined side surface through the aforementioned separation step, as shown in FIG. 20. In other words, the Al composition ratio of the portion of the n-type cladding layer 53 formed on the side surface of the step portion Sic of the n-type GaN substrate 51 is lower than the Al composition ratio of the portion of the n-type cladding layer 53 formed on the region 51b of the n-type GaN substrate 51 in the nitride-based semiconductor laser diode formed according to the method of the fourth embodiment.

According to the fourth embodiment, as hereinabove described, the Al composition ratio of the portions of the n-type cladding layer 53 formed on the side surfaces of the groove portions 51a is reduced below the Al composition ratio of the portions of the n-type cladding layer 53 formed on the regions 51b of the n-type GaN substrate 51 when the nitride-based semiconductor device layer 60 is formed on the n-type GaN substrate 51 through the buffer layer 52 so that strain caused on the n-type cladding layer 53 due to the difference between the lattice constants of the n-type GaN substrate 51 (lattice constant: about 0.3189 nm) and the n-type cladding layer 53 (lattice constant: about 0.3184 nm) of n-type $Al_{0.07}Ga_{0.93}N$ is relaxed on the portions, having the lower Al composition ratio, of the n-type cladding layer 53 located on the side surfaces of the groove portions 51a, whereby the strain caused on the n-type cladding layer 53 can be reduced. Thus, the quantity of cracks formed on the n-type cladding layer 53 can be inhibited from increase resulting from remarkable strain of the n-type cladding layer 53. Therefore, the quantity of cracks formed on the nitride-based semiconductor device layer 60 including the n-type cladding layer 53 can also be inhibited from increase, whereby the cracks can be inhibited from increasing a leakage current not supplied to the light-emitting portions of the nitride-based semiconductor device layer 60 and hindering a transmission of a light, Consequently, the nitride-based semiconductor laser diode can be inhibited from reduction of characteristics and a yield.

According to the fourth embodiment, the opening width of each groove portion 51a formed on the n-type GaN substrate 51 is gradually increased from the bottom surface toward the opening end of the groove portion 51a so that Ga which is one of the constituents of the n-type cladding layer 53, more easily movable on a growth surface as compared with Al, conceivably moves toward the side surfaces of the groove portions 51a when the n-type cladding layer 53 of n-type $Al_{0.07}Ga_{0.93}N$ is formed on the n-type GaN substrate 51 through the buffer layer 52, whereby the Al composition ratio of the portions of the n-type cladding layer 53 formed on the side surfaces of the groove portions 51a can be easily reduced below the Al composition ratio of the portions of the n-type cladding layer 53 formed on the regions 51b of the n-type GaN substrate 51.

The remaining effects of the fourth embodiment are similar to those of the aforementioned first embodiment.

(Fifth Embodiment)

Figure 21:
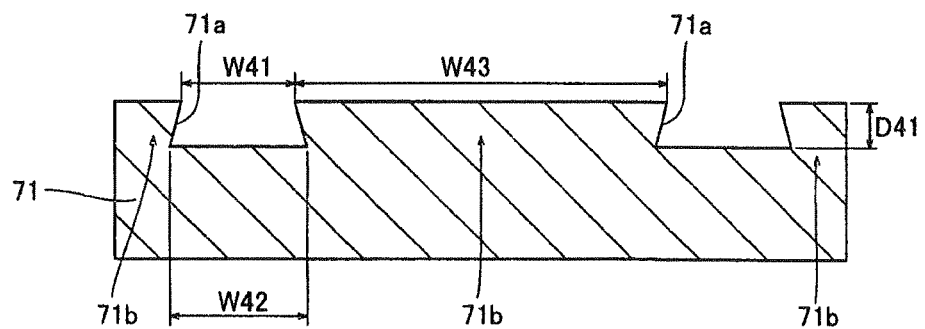
FIG. 21 is a sectional view for illustrating a method of fabricating a nitride-based semiconductor laser diode according to a fifth embodiment of the present invention.

FIG. 21 is a sectional view for illustrating a method of fabricating a nitride-based semiconductor laser diode according to a fifth embodiment of the present invention. Referring to FIG. 21, the opening width of each groove portion 71a formed on an n-type GaN substrate 71 is gradually reduced from the bottom surface toward the opening end of the groove portion 71a in the method of fabricating a nitride-based semiconductor laser diode according to the fifth embodiment, dissimilarly to the aforementioned fourth embodiment.

In the method of fabricating a nitride-based semiconductor laser diode according to the fifth embodiment, striped (slender) groove portions 71a having a depth D41 of about 2 μm and extending in a prescribed direction are first formed on the n-type GaN substrate 71 through steps similar to those of the first embodiment shown in FIGS. 1 to 4, as shown in FIG. 21. According to the fifth embodiment, however, the n-type GaN substrate 71 is obliquely set on a base (not shown) of an etching apparatus and etched in a rotational manner, so that each groove portion 71a has a shape with overhung sidewalls. In other words, each groove portion 71a is so formed that the opening width thereof is gradually reduced from the bottom surface toward the opening end thereof. More specifically, each groove portion 71a is so formed that the width W41 of the opening end thereof is about 50 μm and the width W42 of the bottom surface thereof is about 53 μm. Further, the distance W43 between the groove portions 71a adjacent to each other is set to about 200 μm. Regions 71b, each having the width W43 of about 200 μm, of the n-type GaN substrate 71 located between the groove portions 71a correspond to light-emitting portions located under ridge portions (not shown) of a nitride-based semiconductor device layer. The n-type GaN substrate 71 is an example of the "nitride-based semiconductor substrate" in the present invention. The regions 71b of the n-type GaN substrate 71 are examples of the "first region" in the present invention, and the regions of the n-type GaN substrate 71 formed with the groove portions 71a are examples of the "second region" in the present invention.

According to the fifth embodiment, the n-type GaN substrate 71 has a surface of the (0001) plane and a low dislocation density, similarly to the n-type GaN substrate 1 in the aforementioned first embodiment. The lattice constant of the n-type GaN substrate 71 is about 0.3189 nm.

The remaining steps of the fabrication method according to the fifth embodiment are similar to those in the aforementioned first embodiment.

According to the fifth embodiment, as hereinabove described, each groove portion 71a is so formed on the n-type GaN substrate 71 that the opening width thereof is gradually reduced from the bottom surface toward the opening end so that materials constituting nitride-based semiconductor layers are more hardly deposited on the side surfaces of the groove portions 71a as compared with the first embodiment in which the side surfaces of the groove portions 1a are perpendicular to the upper surface of the n-type GaN substrate 1, whereby the thicknesses of portions of the nitride-based semiconductor layers formed on the side surfaces of the groove portions 71a can be more easily reduced below those of portions of the nitride-based semiconductor layers formed on the regions 71b of the n-type GaN substrate 71.

The remaining effects of the fifth embodiment are similar to those of the aforementioned first embodiment.

(Sixth Embodiment)

Figure 22:
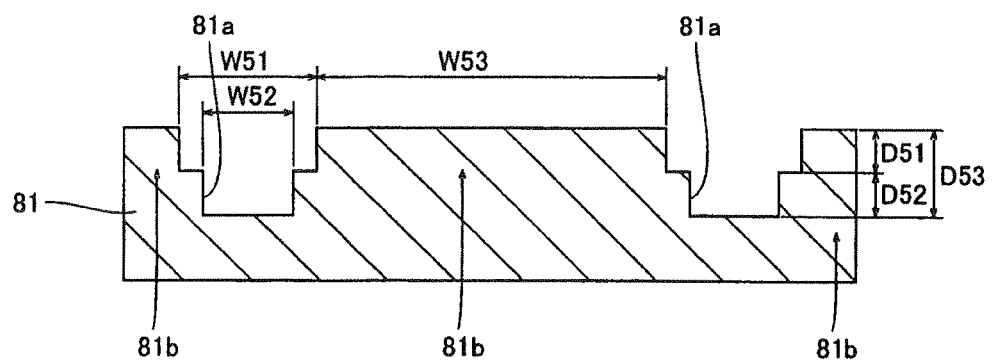
FIG. 22 is a sectional view for illustrating a method of fabricating a nitride-based semiconductor laser diode according to a sixth embodiment of the present invention.

Referring to FIG. 22, the side surfaces of groove portions 81a formed on an n-type GaN substrate 81 are stepped in a method of fabricating a nitride-based semiconductor laser diode according to a sixth embodiment of the present invention, dissimilarly to the aforementioned fourth and fifth embodiments.

In the method of fabricating a nitride-based semiconductor laser diode according to the sixth embodiment, striped (slender) groove portions 81a extending in a prescribed direction are formed on the n-type GaN substrate 81 through steps similar to those of the first embodiment shown in FIGS. 1 to 4, as shown in FIG. 22. According to the sixth embodiment, however, two etching steps are carried out for forming the groove portions 81a. More specifically, first grooves having a width W51 of about 50 μm and a depth D51 of about 1 μm are formed in the first etching step. Thereafter second grooves having a width W52 of about 30 µm and a depth D52 of about 1 µm are formed in the second etching step on the bottoms of the first grooves formed in the first etching step. Thus, the groove portions 81a having stepped side surfaces are formed with the width (opening end width) W51 of about 50 µm and a depth D53 of about 2 µm. The distance W53 between the groove portions 81a adjacent to each other is set to about 200 µm. Regions 81b, having a width W53 of about 200 µm, of the n-type GaN substrate 81 held between the groove portions 81a correspond to light-emitting portions located under ridge portions (not shown) of a nitride-based semiconductor device layer. The n-type GaN substrate 81 is an example of the "nitride-based semiconductor substrate" in the present invention. The regions 81b of the n-type GaN substrate 81 are examples of the "first region" in the present invention, and the regions of the n-type GaN substrate 81 formed with the groove portions 81a are examples of the "second region" in the present invention.

According to the sixth embodiment, the n-type GaN substrate 81 has a surface of the (0001) plane and a low dislocation density, similarly to the n-type GaN substrate 1 in the aforementioned first embodiment. The lattice constant of the n-type GaN substrate 81 is about 0.3189 nm.

The remaining steps of the fabrication method according to the sixth embodiment are similar to those in the aforementioned first embodiment.

According to the sixth embodiment, as hereinabove described, the striped (slender) groove portions 81a extending in the prescribed direction are formed on the n-type GaN substrate 81 with stepped side surfaces, whereby effects similar to those of the aforementioned first embodiment can be attained.

While the nitride-based semiconductor layers are formed on the (0001) plane of the GaN substrate in each of the aforementioned first to sixth embodiments, the present invention is not restricted to this but the nitride-based semiconductor layers may alternatively be formed on a plane, having another plane direction, of the GaN substrate. For example, the nitride-based semiconductor layers may be formed on a (H,K,-H-K,0) plane such as the (1-100) or (11-20) plane. In this case, no piezoelectric field is generated in a light-emitting layer, whereby luminous efficiency of the light-emitting layer can be improved. Seventh and eighth embodiments of the present invention employing this structure are now described.

(Seventh Embodiment)

Figure 23:
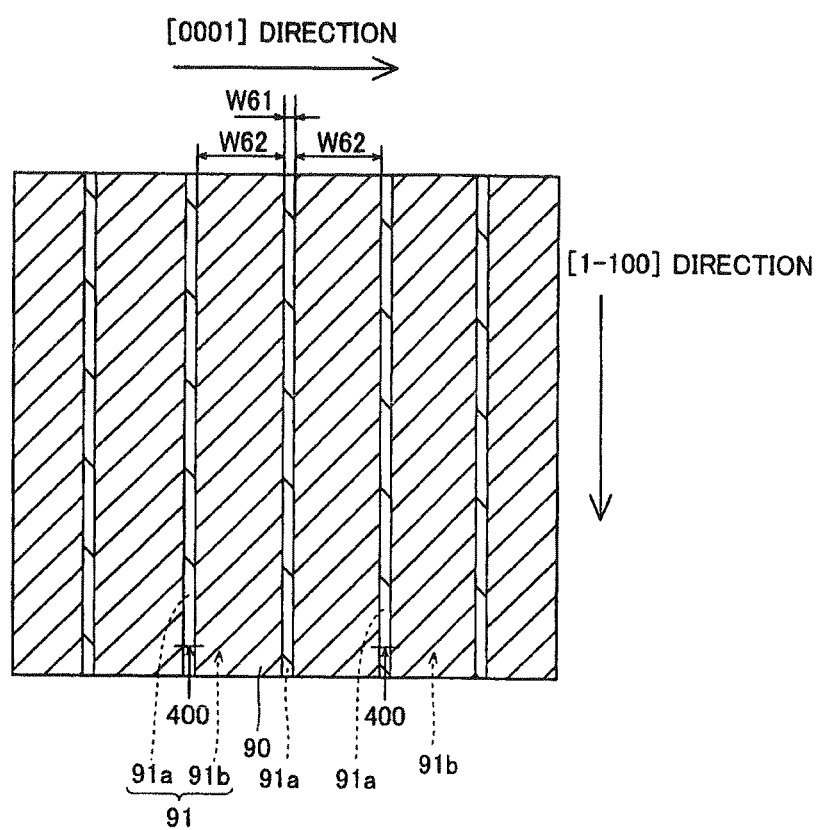
FIG. 23 is a plan view for illustrating a nitride-based semiconductor laser diode fabricated by a method according to a seventh embodiment of the present invention.
Figure 24:
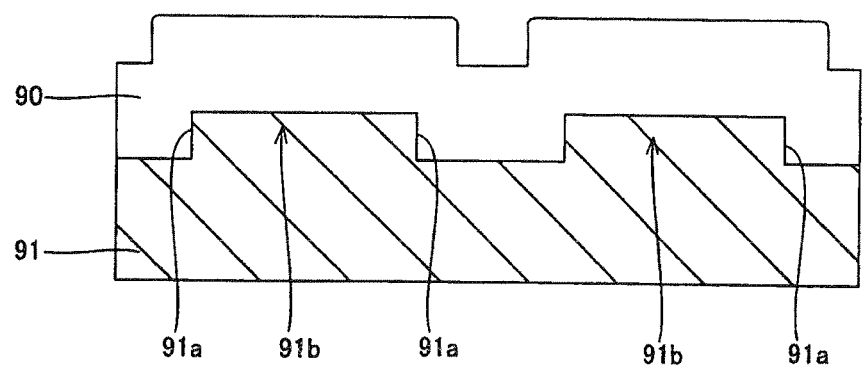
FIG. 24 is a sectional view taken along the line 400-400 in FIG. 23.

A method of fabricating a nitride-based semiconductor laser diode according to the seventh embodiment of the present invention is different from the method according to the first embodiment in a point that an n-type GaN substrate 91 having a surface of the (11-20) plane is employed with groove portions 91a formed to extend in the [1-100] direction. The method of fabricating a nitride-based semiconductor laser diode according to the seventh embodiment of the present invention is now described with reference to FIGS. 23 and 24.

Also according to the seventh embodiment, striped (slender) groove portions 91a having a width W61 of about 50 µm and a depth of about 2 µm are formed on the n-type GaN substrate 91 with side surfaces perpendicular to the upper surface of the n-type GaN substrate 91 through steps similar to those of the first embodiment shown in FIGS. 1 to 4. According to the seventh embodiment, however, the n-type GaN substrate 91 has the surface of the (11-20) plane and the groove portions 91a are formed to extend in the [1-100] direction, as described above. At this time, the n-type GaN substrate 91 is formed with regions 91b, having a width W62 in the [0001] direction, held between regions formed with the groove portions 91a. The n-type GaN substrate 91 is an example of the "nitride-based semiconductor substrate" in the present invention, and the regions formed with the groove portions 91a are examples of the "second region" in the present invention. The regions 91b are examples of the "first region" in the present invention.

A nitride-based semiconductor device layer 90 is formed on the n-type GaN substrate 91 through a step similar to that in the aforementioned first embodiment.

This nitride-based semiconductor device layer 90 is formed to have an n-type cladding layer, an active layer and a p-type cladding layer from the side closer to the n-type GaN substrate 91, similarly to the aforementioned first embodiment.

The n-type cladding layer included in the nitride-based semiconductor device layer 90 is generally formed by an AlGaN layer, and the difference between the lattice constants of this AlGaN layer and the n-type GaN substrate 91 varies with the crystal orientation of the n-type GaN substrate 91. For example, the lattice constants of $Al_{0.07}Ga_{0.93}N$ and GaN in the a-axis direction are about 0.3184 nm and about 0.3189 nm respectively, and the ratio therebetween is 0.9984. On the other hand, the lattice constants of $Al_{0.07}Ga_{0.93}N$ and GaN in the c-axis direction are about 0.5172 nm and about 0.5186 nm respectively, and the ratio therebetween is 0.9973. Thus, the lattice constant ratios between $Al_{0.07}Ga_{0.93}N$ and GaN are 0.9984 and 0.9973 in the a-axis direction and the c-axis direction respectively, and the ratio in the c-axis direction more largely deviates from 1. Therefore, larger strain or stress is applied to the AlGaN layer of the nitride-based semiconductor laser diode fabricated according to the seventh embodiment employing the n-type GaN substrate 91 having the (11-20) plane including the c-axis direction as the in-plane axis direction, as compared with the nitride-based semiconductor laser diode fabricated according to each of the first to sixth embodiments employing the GaN substrate having the (0001) plane with only the a-axis in-plane direction. In the nitride-based semiconductor laser diode fabricated by the method according to the seventh embodiment, therefore, the AlGaN layer is more easily cracked as compared with that in the nitride-based semiconductor laser diode fabricated according to each of the first to sixth embodiments, and hence the nitride-based semiconductor device layer 90 is easily cracked.

According to the seventh embodiment, therefore, the groove portions 91a provided on the n-type GaN substrate 91 are formed to extend in the [1-100] direction.

The [1-100] direction corresponds to the m-axis direction, and the magnitude of strain or stress in the m-axis direction is substantially equal to the magnitude of strain or stress in the a-axis direction in crystal structure. In the case of employing the n-type GaN substrate 91 having the (11-20) plane, therefore, strain or stress in the [0001] c-axis direction is larger than that in the [1-100] m-axis direction, whereby cracks are more easily formed in the direction intersecting with the direction than in the direction intersecting with the [1-100] direction. Thus, propagation of cracks formed in the direction intersecting with the [0001] direction can be effectively suppressed by providing the groove portions 91a along the [1-100] axis direction intersecting with the [0001] direction according to the seventh embodiment. According to the seventh embodiment, propagation of cracks is suppressed in the direction causing a large number of cracks, thereby obtaining higher effects.

According to the seventh embodiment, the opening width of each groove portion 91a formed on the n-type GaN substrate 91 is preferably gradually increased from the bottom surface toward the opening end thereof, similarly to the aforementioned fourth embodiment. When the groove portions 91a have a mesa sectional shape, Ga which is one of the constituents of the AlGaN layer conceivably easily moves toward inclined side surfaces of the groove portions 91a when the nitride-based semiconductor device layer 90 including the AlGaN layer is formed on the n-type GaN substrate 91. Therefore, the Al composition ratio of portions of the AlGaN layer formed on the side surfaces of the groove portions 91a is reduced below the Al composition ratio of portions of the AlGaN layer formed on the regions 91b of the n-type GaN substrate 91. More specifically, the Al composition ratio of the portions of the AlGaN layer formed on the regions 91b of the n-type GaN substrate 91 is about 7% while the Al composition ratio of the portions of the AlGaN layer formed on the side surfaces of the groove portions 91a is about 1.4% when a layer having an Al composition ratio of about 7% is formed as the AlGaN layer. In this case, the lattice constant of the portions, having the lower Al composition ratio, of the AlGaN layer located on the side surfaces of the groove portions 91a approaches the lattice constant of the n-type GaN substrate 91, whereby the difference between the lattice constants of the n-type GaN substrate 91 and the AlGaN layer is reduced on the portions, having the lower Al composition ratio, of the AlGaN layer located on the side surfaces of the groove portions 91a. Also when the AlGaN layer is strained due to the difference between the lattice constants of the n-type GaN substrate 91 and the AlGaN layer included in the nitride-based semiconductor device layer 90, therefore, the strain is relaxed on the portions, having the lower Al composition ratio, of the AlGaN layer located on the side surfaces of the groove portions 91a, whereby the strain caused on the AlGaN layer is reduced. Thus, the quantity of cracks formed on the AlGaN layer is inhibited from increase, and the quantity of cracks formed on the nitride-based semiconductor device layer 90 including the AlGaN layer is also inhibited from increase.

The remaining steps of the fabrication method according to the seventh embodiment are similar to those in the aforementioned first embodiment.

Effects of the seventh embodiment are similar to those of the aforementioned first embodiment.

(Eighth Embodiment)

Figure 25:
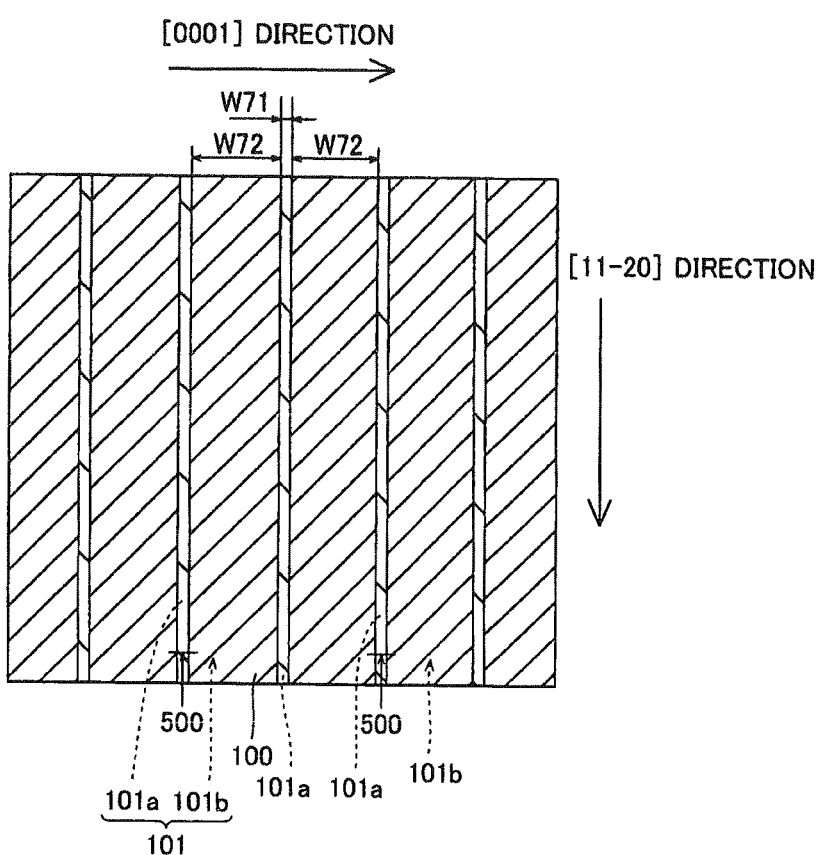
FIG. 25 is a plan view for illustrating a nitride-based semiconductor laser diode fabricated according to an eighth embodiment of the present invention.
Figure 26:
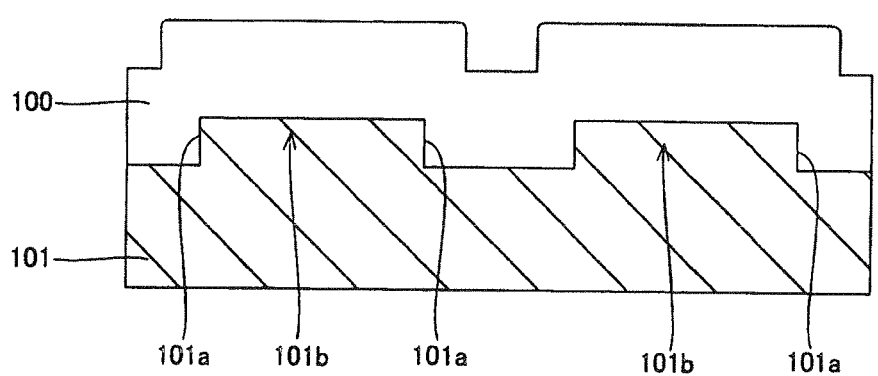
FIG. 26 is a sectional view taken along the line 500-500 in FIG. 25.

A method of fabricating a nitride-based semiconductor laser diode according to the eighth embodiment of the present invention is dissimilar to that according to the first embodiment in a point that an n-type GaN substrate 101 having a surface of the (1-100) plane is employed and a point that groove portions 101a are formed to extend in the [11-20] direction. The method of fabricating a nitride-based semiconductor laser diode according to the eighth embodiment of the present invention is now described with reference to FIGS. 25 and 26.

Also according to the eighth embodiment, striped (slender) groove portions 101a having a width W71 of about 50 μm and a depth of about 2 μm are formed on the n-type GaN substrate 101 with side surfaces perpendicular to the upper surface of the n-type GaN substrate 101 through steps similar to those of the first embodiment shown in FIGS. 1 to 4. According to the eighth embodiment, however, the n-type GaN substrate 101 has the surface of the (1-100) plane and the groove portions 101a are so formed as to extend in the [11-20] direction, as described above. At this time, the n-type GaN substrate 101 is formed with regions 101b, having a width W72 in the [0001] direction, held between regions formed with the groove portions 101a. The n-type GaN substrate 101 is an example of the "nitride-based semiconductor substrate" in the present invention, and the regions formed with the groove portions 101a are examples of the "second region" in the present invention. The regions 101b are examples of the "first region" in the present invention.

A nitride-based semiconductor device layer 100 is formed on the n-type GaN substrate 101 through a step similar to that in the aforementioned first embodiment. This nitride-based semiconductor device layer 100 is formed to have an n-type cladding layer, an active layer and a p-type cladding layer from the side closer to the n-type GaN substrate 101, similarly to the aforementioned first embodiment.

The n-type GaN substrate 101 employed in the eighth embodiment also includes the c-axis direction in the in-plane direction, similarly to the aforementioned seventh embodiment. Therefore, larger strain or stress is applied to an AlGaN layer of the nitride-based semiconductor laser diode fabricated according to the eighth embodiment employing the n-type GaN substrate 101 having the (1-100) plane including the c-axis direction as the in-plane axis direction, as compared with the nitride-based semiconductor laser diode fabricated according to each of the first to sixth embodiments employing the GaN substrate having the (0001) plane with only the a-axis in-plane direction. Also in the nitride-based semiconductor laser diode fabricated by the method according to the eighth embodiment, therefore, the AlGaN layer is more easily cracked as compared with that in the nitride-based semiconductor laser diode fabricated according to each of the first to sixth embodiments, and hence the nitride-based semiconductor device layer 100 is easily cracked.

According to the eighth embodiment, therefore, the groove portions 101a provided on the n-type GaN substrate 101 are so formed as to extend in the [11-20] direction.

The [11-20] direction corresponds to the a-axis direction, whereby cracks are more easily formed in the direction intersecting with the [0001] direction than in the direction intersecting with the [1-100] direction in the eighth embodiment employing the n-type GaN substrate 101 of the (1-100) plane. Therefore, propagation of cracks formed in the direction intersecting with the [0001] direction can be effectively suppressed by providing the groove portions 101a along the [11-20] axis direction intersecting with the [0001] direction according to the eighth embodiment. According to the eighth embodiment, propagation of cracks is suppressed in the direction causing a large number of cracks, thereby obtaining higher effects.

According to the eighth embodiment, the opening width of each groove portion 101a formed on the n-type GaN substrate 101 is preferably gradually increased from the bottom surface toward the opening end thereof, similarly to the aforementioned fourth embodiment. When the groove portions 101a have a mesa sectional shape, Ga which is one of the constituents of the AlGaN layer conceivably easily moves toward inclined side surfaces of the groove portions 101a when the nitride-based semiconductor device layer 100 including the AlGaN layer is formed on the n-type GaN substrate 101. Therefore, the Al composition ratio of portions of the AlGaN layer formed on the side surfaces of the groove portions 101a is reduced below the Al composition ratio of portions of the AlGaN layer formed on the regions 101b of the n-type GaN substrate 101. More specifically, the Al composition ratio of the portions of the AlGaN layer formed on the regions 101b of the n-type GaN substrate 101 is about 7% while the Al composition ratio of the portions of the AlGaN layer formed on the side surfaces of the groove portions 101a is about 0.7% when a layer having an Al composition ratio of about 7% is formed as the AlGaN layer. In this case, the lattice constant of the portions, having the lower Al composition ratio, of the AlGaN layer located on the side surfaces of the groove portions 101a approaches the lattice constant of the n-type GaN substrate 101, whereby the difference between the lattice constants of the n-type GaN substrate 101 and the AlGaN layer is reduced on the portions, having the lower Al composition ratio, of the AlGaN layer located on the side surfaces of the groove portions 101a. Also when the AlGaN layer is strained due to the difference between the lattice constants of the n-type GaN substrate 101 and the AlGaN layer included in the nitride-based semiconductor device layer 100, therefore, the strain is relaxed on the portions, having the lower Al composition ratio, of the AlGaN layer located on the side surfaces of the groove portions 101a, whereby the strain caused on the AlGaN layer is reduced. Thus, the quantity of cracks formed on the AlGaN layer is inhibited from increase, and the quantity of cracks formed on the nitride-based semiconductor device layer 100 including the AlGaN layer is also inhibited from increase.

The remaining steps of the fabrication method according to the eighth embodiment are similar to those of the aforementioned first embodiment.

The remaining effects of the eighth embodiment are similar to those of the aforementioned seventh embodiment.

(Ninth Embodiment)

Figure 27:
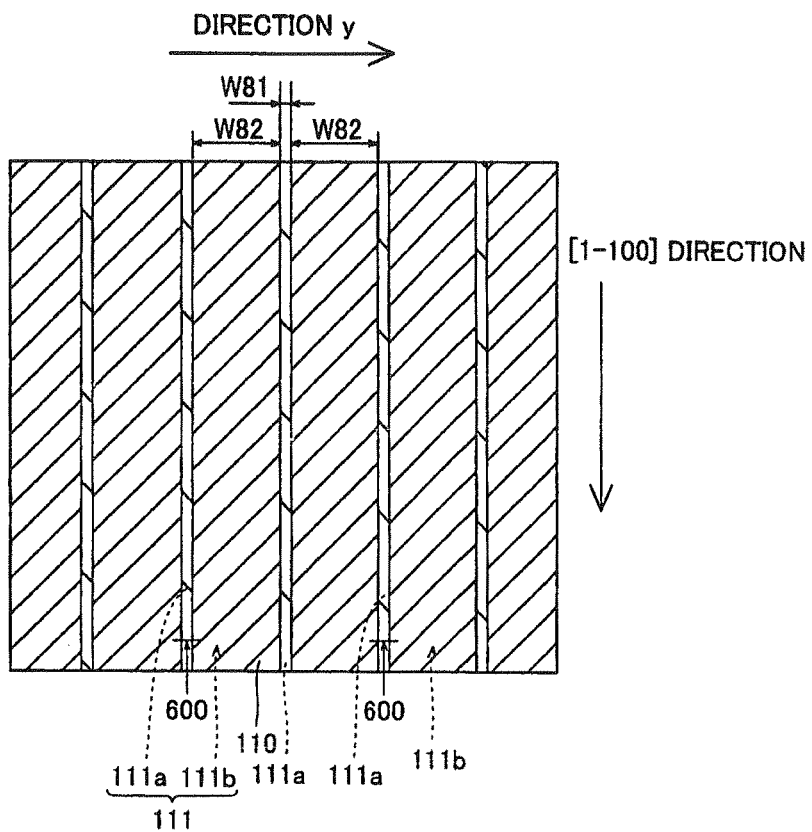
FIG. 27 is a plan view for illustrating a method of fabricating a nitride-based semiconductor laser diode according to a ninth embodiment of the present invention.
Figure 28:
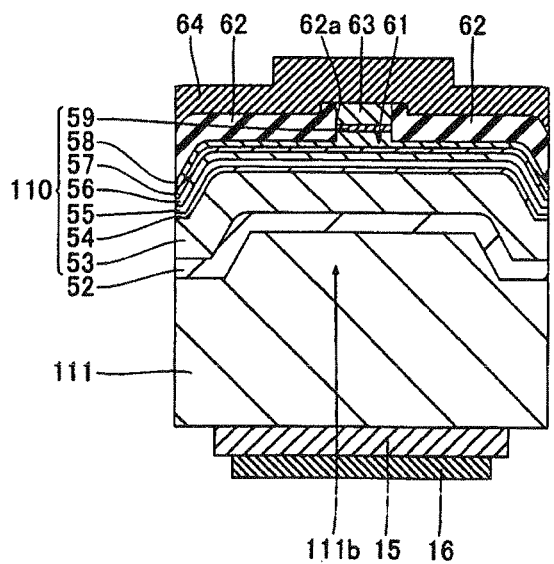
FIG. 28 is a sectional view taken along the line 600-600 in FIG. 27.

A method of fabricating a nitride-based semiconductor laser diode according to a ninth embodiment of the present invention is different from the method of fabricating a nitride-based semiconductor laser diode according to the seventh embodiment in a point that an n-type GaN substrate 111 having a surface of the (11-22) plane is employed and a point that the opening width of each groove portion 111a is gradually increased from the bottom surface toward the opening end thereof. The method of fabricating a nitride-based semiconductor laser diode according to the ninth embodiment of the present invention is now described with reference to FIGS. 27 and 28.

According to the ninth embodiment, striped (slender) groove portions 111a having a width (opening end width) W81 of about 50 µm and a depth of about 2 µm with a mesa sectional shape are formed on the n-type GaN substrate 111 through steps similar to those of the fourth embodiment shown in FIGS. 17 to 20. According to the ninth embodiment, however, the n-type GaN substrate 111 has the surface of the (11-22) plane and the groove portions 111a are so formed as to extend in the [1-100] direction, as described above. At this time, the n-type GaN substrate 111 is formed with regions 111b, having a width W82 in a direction y described later, held between regions formed with the groove portions 111a. The n-type GaN substrate 111 is an example of the "nitride-based semiconductor substrate" in the present invention, and the regions formed with the groove portions 111a are examples of the "second region" in the present invention. The regions 111b are examples of the "first region" in the present invention.

Then, nitride-based semiconductor layers (53 to 59) constituting a nitride-based semiconductor device layer 110 are successively formed on the upper surfaces of the 111b of the n-type GaN substrate 111 and the bottom and side surfaces of the groove portions 111a by MOCVD through a buffer layer 52.

More specifically, TMGa gas (about 66 µmol/min.) and TMAl gas (about 0.26 µmol/min.) are supplied into a reactor with $H_2$ gas employed as carrier gas, thereby growing the buffer layer 52 of undoped $Al_{0.01}Ga_{0.99}N$ having a thickness of about 0.8 µm on the n-type GaN substrate 111 at a growth rate of about 1.1 µm/h. when the n-type GaN substrate 111 reaches a temperature of about 1160° C. Thereafter TMGa gas (about 90 µmol/min.), TMAl gas (about 2.4 µmol/min.) and $GeH_4$ gas (about 0.24 µmol/min.) employed as a Ge material serving as an n-type impurity are supplied into the reactor with $H_2$ gas employed as carrier gas, thereby growing an n-type cladding layer 53 of n-type $Al_{0.07}Ga_{0.93}N$ doped with Ge having a thickness of about 1.8 µm on the buffer layer 52 at a growth rate of about 1.1 µm/h.

Further, TMGa gas (about 48 µmol/min.) and TMAl gas (about 4.7 µmol/min.) are supplied into the reactor with $H_2$ gas employed as carrier gas, thereby growing an n-side carrier blocking layer 54 of undoped $Al_{0.2}Ga_{0.8}N$ having a thickness of about 20 nm on the n-type cladding layer 53 at a growth rate of about 1 µm/h.

Then, the temperature of the n-type GaN substrate 111 is reduced from about 1160° C. to about 850° C. Then, TEGa gas and TMIn gas employed as Ga and In materials respectively are supplied into the reactor with $H_2$ gas employed as carrier gas, thereby alternately growing four barrier layers (not shown) of undoped $In_{0.02}Ga_{0.98}N$ each having a thickness of about 20 nm and three quantum well layers (not shown) of undoped $In_{0.15}Ga_{0.85}N$ each having a thickness of about 3.5 nm on the n-side carrier blocking layer 54 at a growth rate of about 0.25 µm/h. Thus, an MQW active layer 55 is formed in an MQW structure obtained by alternately stacking the four barrier layers and the three quantum well layers with each other. Then, a p-side light guide layer 56 of undoped $In_{0.15}Ga_{0.98}N$ having a thickness of about 0.1 µm is grown on the MQW active layer 55. Thereafter TMGa gas (about 103 µmol/min.) and TMAl gas (about 400 µmol/min.) are supplied into the reactor with $N_2$ gas employed as carrier gas, thereby growing a p-side carrier blocking layer 57 of undoped $Al_{0.2}Ga_{0.8}N$ having a thickness of about 20 nm on the p-side light guide layer 56 at a growth rate of about 1.2 µm/h.

Then, the temperature of the n-type GaN substrate 111 is increased from about 850° C. to about 1160° C. Then, TMGa gas (about 54 µmol/min.), TMAl gas (about 1.7 µmol/min.) and $Mg(C_5H_5)_2$ gas (about 0.038 µmol/min.) employed as an Mg material serving as a p-type impurity are supplied into the reactor with $N_2$ gas employed as carrier gas, thereby growing a p-type cladding layer 58 of p-type $Al_{0.07}Ga_{0.93}N$ doped with Mg having a thickness of about 0.45 µm on the p-side carrier blocking layer 57 at a rate of about 1.1 µm/h. Since the Al composition and the growth rate of AlGaN varies with the type and the quantity of dopant gas, the flow rates of the supplied TMGa gas and TMAl are so adjusted as to grow the n-type cladding layer 53 and the p-type cladding layer 58 having the same Al composition at the same growth rate. Thereafter the temperature of the n-type GaN substrate 111 is reduced from about 1160° C. to about 850° C. Then, TEGa gas and TMIn gas are supplied into the reactor with $N_2$ gas employed as carrier gas, thereby growing a p-side contact layer 59 of undoped $In_{0.07}Ga_{0.93}N$ having a thickness of about 3 nm on the p-type cladding layer 58 at a growth rate of about 0.25 µm/h. Thus, the nitride-based semiconductor device layer 110 constituted of the nitride-based semiconductor layers (53 to 59) is formed on the upper surfaces of the regions 111b of the n-type GaN substrate 111 and the bottom and side surfaces of the groove portions 111a through the buffer layer 52.

The n-type cladding layer 53 included in the nitride-based semiconductor device layer 110 is generally formed by an AlGaN layer, and the difference between the lattice constants of this AlGaN layer and the n-type GaN substrate ill varies with the crystal orientation of the n-type GaN substrate 111. For example, the lattice constants of $Al_{0.07}Ga_{0.93}N$ and GaN in the a-axis direction are about 0.3184 nm and about 0.3189 nm respectively, and the ratio therebetween is 0.9984. On the other hand, the lattice constants of $Al_{0.07}Ga_{0.93}N$ and GaN in the c-axis direction are about 0.5172 nm and about 0.5186 nm respectively, and the ratio therebetween is 0.9973. Thus, the lattice constant ratios between $Al_{0.07}Ga_{0.93}N$ and GaN are 0.9984 and 0.9973 in the a-axis direction and the c-axis direction respectively, and the ratio in the c-axis direction more largely deviates from 1. According to the ninth embodiment employing the n-type GaN substrate 111 having the (11-22) plane, the in-plane directions include the [1-100] direction, the [1-100] direction and the direction (hereinafter referred to as a direction y) perpendicular to the [11-22] direction. The lattice constant ratio between AlGaN and GaN in the [1-100] direction is equal to that in the a-axis direction. On the other hand, the lattice constant ratio between AlGaN and GaN in the direction y, having components in the a-axis direction and the c-axis direction, is at an intermediate level between the lattice constant ratios between AlGaN and GaN in the a-axis direction and the c-axis direction and higher than the lattice constant ratio between AlGaN and GaN in the a-axis direction. Therefore, larger strain or stress is applied to the AlGaN layer of the nitride-based semiconductor laser diode fabricated according to the ninth embodiment employing the n-type GaN substrate 111 having the (11-22) plane, as compared with the nitride-based semiconductor laser diode fabricated according to each of the first to sixth embodiments employing the GaN substrate having the (0001) plane with only the a-axis in-plane direction. In the nitride-based semiconductor laser diode fabricated by the method according to the ninth embodiment, therefore, the AlGaN layer is more easily cracked as compared with that in the nitride-based semiconductor laser diode fabricated according to each of the first to sixth embodiments, and hence the nitride-based semiconductor device layer 110 is easily cracked.

According to the ninth embodiment, therefore, the groove portions 111a provided on the n-type GaN substrate 111 are so formed as to extend in the [1-100] direction.

The [1-100] direction corresponds to the m-axis direction, and the magnitude of strain or stress in the m-axis direction is substantially equal to the magnitude of strain or stress in the a-axis direction in crystal structure. In the case of employing the n-type GaN substrate 111 having the (11-22) plane, therefore, strain or stress in the direction y is larger than that in the [1-100] m-axis direction, whereby cracks are more easily formed in the direction intersecting with the direction y than in the direction intersecting with the [1-100] direction. Thus, propagation of cracks formed in the direction intersecting with the direction y can be effectively suppressed by providing the groove portions 111a along the [1-100] axis direction intersecting with the direction y according to the ninth embodiment. According to the ninth embodiment, propagation of cracks is suppressed in the direction causing a large number of cracks, thereby obtaining higher effects.

According to the ninth embodiment, the opening width of each groove portion 111a formed on the n-type GaN substrate 111 is gradually increased from the bottom surface toward the opening end thereof, similarly to the aforementioned fourth embodiment. When the groove portions 111a have a mesa sectional shape, Ga which is one of the constituents of the AlGaN layer conceivably easily moves toward inclined side surfaces of the groove portions 111a when the nitride-based semiconductor device layer 110 including the AlGaN layer is formed on the n-type GaN substrate 111. Therefore, the Al composition ratio of portions of the AlGaN layer formed on the side surfaces of the groove portions 111a is reduced below the Al composition ratio of portions of the AlGaN layer formed on the regions 111b of the n-type GaN substrate 111.

More specifically, the Al composition ratio of the portions of the n-type cladding layer 53, consisting of n-type AlGaN doped with Ge, formed on the regions 111b of the n-type GaN substrate 111 is about 7% while the Al composition ratio of the portions of the AlGaN layer formed on the side surfaces of the groove portions 111a is about 1.7% to about 2.6% when a layer having an Al composition ratio of about 7% is formed as the AlGaN layer. When another layer having an Al composition ratio of about 7% is formed as another AlGaN layer, further, the Al composition ratio of the portions of the p-type cladding layer 58, consisting of p-type AlGaN doped with Mg, formed on the regions 111b of the n-type GaN substrate 111 is about 7% while the Al composition ratio of the portions of the AlGaN layer formed on the side surfaces of the groove portions 111a is about 3.9% to about 4.3%. In this case, the lattice constant of the portions, having the lower Al composition ratio, of the AlGaN layer formed on the side surfaces of the groove portions 111a approaches the lattice constant of the n-type GaN substrate 111, whereby the difference between the lattice constants of the n-type GaN substrate 111 and the AlGaN layer is reduced on the portions, having the lower Al composition ratio, of the AlGaN layer located on the side surfaces of the groove portions 111a. Also when the AlGaN layer is strained due to the difference between the lattice constants of the n-type GaN substrate 111 and the AlGaN layer included in the nitride-based semiconductor device layer 110, therefore, the strain is relaxed on the portions, having the lower Al composition ratio, of the AlGaN layer located on the side surfaces of the groove portions 111a, whereby the strain caused on the AlGaN layer is reduced. Thus, the quantity of cracks formed on the AlGaN layer is inhibited from increase, and the quantity of cracks formed on the nitride-based semiconductor device layer 110 including the AlGaN layer is also inhibited from increase.

The remaining steps of the fabrication method according to the ninth embodiment are similar to those in the aforementioned seventh embodiment.

The remaining steps of the fabrication method according to the ninth embodiment are similar to those of the aforementioned seventh embodiment.

According to the ninth embodiment, as hereinabove described, the n-type GaN substrate 111 is so formed that the surface thereof has the (11-22) plane which is a (H,K,-H,-K, L) plane. In general, a piezoelectric field generated in the nitride-based semiconductor layer is maximized when the surface of the nitride-based semiconductor substrate is the (0001) plane if in-plane strain is applied to the nitride-based semiconductor layer, and a piezoelectric field generated in the nitride-based semiconductor layer when the surface of the nitride-based semiconductor substrate is not the (0001) plane is smaller than that generated when the surface of the nitride-based semiconductor substrate is the (0001) plane. Therefore, a piezoelectric field generated in the MQW active layer 55 can be reduced by forming the surface of the n-type GaN substrate 111 by the (11-22) plane other than the (0001) plane. Thus, luminous efficiency can be improved.

According to the ninth embodiment, the n-type GaN substrate 111 has the surface of the (11-22) plane so that atomic-layer steps can be formed on the surface, whereby the mode of crystal growth tends to be step-flow growth starting from the steps as compared with growth on the (0001), (11-20) and (1-100) planes having smaller density of atomic-layer steps, thereby improving crystallinity of the nitride-based semiconductor light-emitting device.

The remaining effects of the ninth embodiment are similar to those of the aforementioned seventh embodiment.

(Tenth Embodiment)

Figure 29:
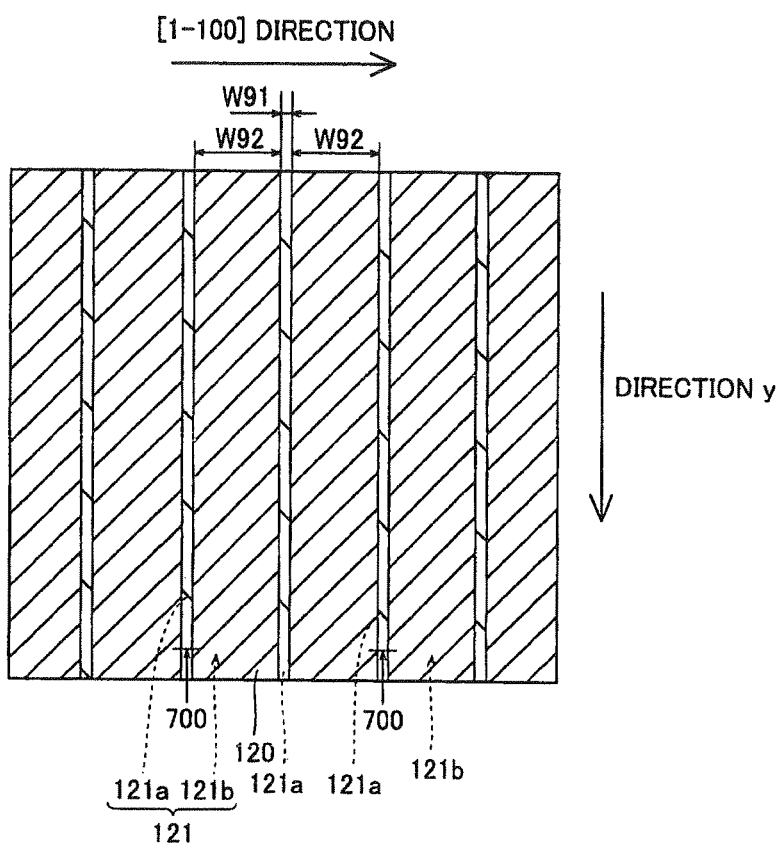
FIG. 29 is a plan view for illustrating a method of fabricating a nitride-based semiconductor laser diode according to a tenth embodiment of the present invention.
Figure 30:
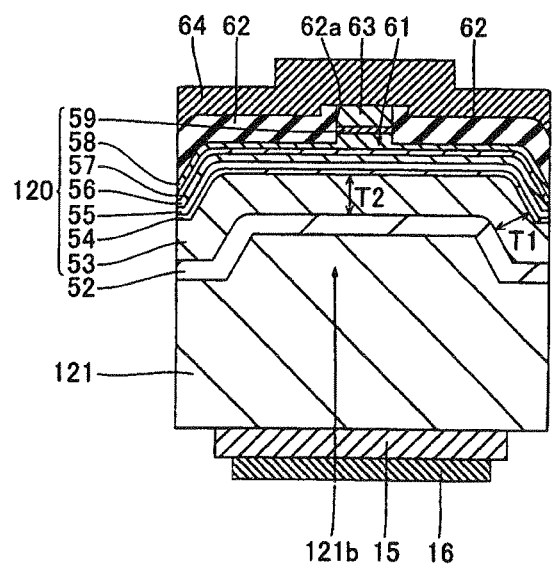
FIG. 30 is a sectional view taken along the line 700-700 in FIG. 29.

A method of fabricating a nitride-based semiconductor laser diode according to a tenth embodiment of the present invention is different from the method according to the ninth embodiment in the direction of groove portions 121a. The method of fabricating a nitride-based semiconductor laser diode according to the tenth embodiment of the present invention is now described with reference to FIGS. 29 and 30.

According to the tenth embodiment, striped (slender) groove portions 121a each having a width (opening end width) W91 of about 50 μm and a depth of about 2 μm with a mesa sectional shape are formed on an n-type GaN substrate 121 through steps similar to those in the aforementioned ninth embodiment. According to the tenth embodiment, however, the groove portions 121a are so formed as to extend in the direction y in the aforementioned ninth embodiment. At this time, regions 121a having a width W92 in the [1-100] direction are formed between regions formed with the groove portions 121a. The n-type GaN substrate 121 is an example of the "nitride-based semiconductor substrate" in the present invention, and the regions formed with the groove portions 121a are examples of the "second region" in the present invention. The regions 121b are examples of the "first region" in the present invention.

A nitride-based semiconductor device layer 120 is formed on the n-type GaN substrate 121 through a step similar to that in the aforementioned ninth embodiment. This nitride-based semiconductor device layer 120 is formed to have an n-type cladding layer 53, an MQW active layer 55 and a p-type cladding layer 58 from the side closer to the n-type GaN substrate 111, similarly to the aforementioned ninth embodiment.

The remaining steps of the fabrication method according to the tenth embodiment are similar to those of the aforementioned ninth embodiment.

According to the tenth embodiment, the thickness (T1=1.1 μm) of portions of the n-type cladding layer 53 consisting of n-type $Al_{0.07}Ga_{0.93}N$ formed on the side surfaces of the groove portions 121a is reduced below the thickness (T2=1.8 μm) of portions of the n-type cladding layer 53 formed on the regions 121b of the n-type GaN substrate 121. When the n-type cladding layer 53 is strained due to the difference between the lattice constant (about 0.3189 nm) of the n-type GaN substrate 121 and the lattice constant (about 0.3184 nm) of the n-type cladding layer 53 of n-type $Al_{0.07}Ga_{0.93}N$, therefore, this strain concentrates on the portions, having the smaller thickness, of the n-type cladding layer 53 located on the side surfaces of the groove portions 121a, whereby the strain caused on the portions of the n-type cladding layer 53 located on the regions 121b of the n-type GaN substrate 121 is relaxed. Thus, the quantity of cracks formed on the nitride-based semiconductor device layer 120 including the n-type cladding layer 53 is inhibited from increase resulting from remarkable strain of the n-type cladding layer 53. Therefore, the quantity of cracks formed on the nitride-based semiconductor device layer 120 including the n-type cladding layer 53 is also inhibited from increase, whereby the cracks can be inhibited from increasing a leakage current not supplied to light-emitting portions of the nitride-semiconductor device layer 120 and hindering a transmission of a light. Consequently, the nitride-based semiconductor laser diode can be inhibited from reduction of characteristics and a yield.

The remaining effects of the tenth embodiment are similar to those of the aforementioned ninth embodiment.

Although the present invention has been described and illustrated in detail, it is clearly understood that the same is by way of illustration and example only and is not to be taken by way of limitation, the spirit and scope of the present invention being limited only by the terms of the appended claims.

For example, while the n-type GaN substrate is employed in each of the aforementioned first to tenth embodiments, the present invention is not restricted to this but a p-type nitride-based semiconductor substrate may alternatively be employed so that a p-type nitride-based semiconductor layer, an active layer and an n-type nitride-based semiconductor layer are successively formed on the p-type nitride-based semiconductor substrate.

While the GaN substrate is employed in each of the aforementioned first to tenth embodiments, the present invention is not restricted to this but a nitride-based semiconductor substrate other than the GaN substrate may alternatively be employed. The nitride-based semiconductor substrate other than the GaN substrate can be prepared from AlGaN, AlN, AlGaInN or AlGaInBN, for example.

Figure 31:
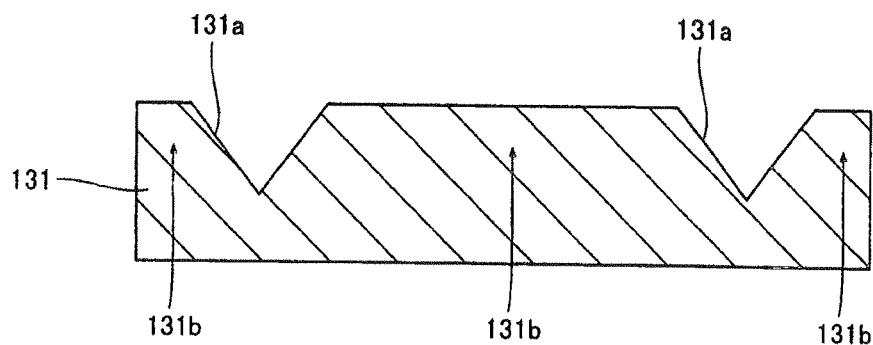
FIG. 31 is a sectional view showing an n-type GaN substrate of a nitride-based semiconductor laser diode fabricated according to a modification of the first to tenth embodiments of the present invention.
Figure 32:
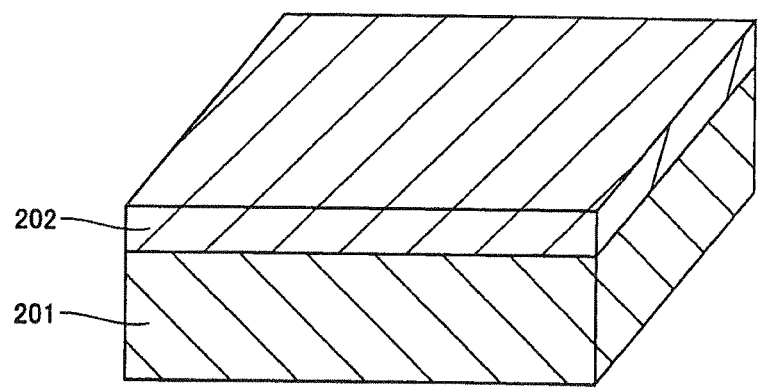
FIG. 32 is a sectional view showing an n-type AlGaN layer grown on an n-type GaN substrate having a planar surface.
Figure 33:
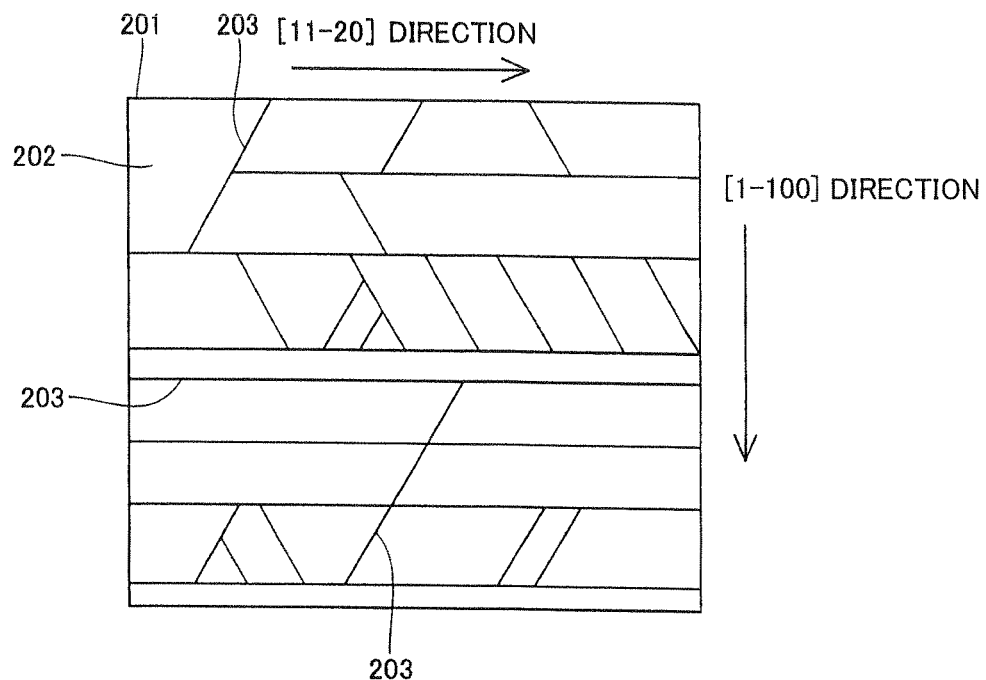
FIG. 33 is a plan view showing cracks formed on the n-type AlGaN layer shown in FIG. 32.

While the groove portions having the bottom surfaces are formed on the n-type GaN substrate in each of the aforementioned first to tenth embodiments, the present invention is not restricted to this but groove portions having no bottom surfaces may alternatively be formed on the n-type GaN substrate. For example, groove portions 131a having a V-shaped section may be formed on an n-type GaN substrate 131, as shown in FIG. 31. The n-type GaN substrate 131 is an example of the "nitride-based semiconductor substrate" in the present invention. According to this structure, Ga constituting an AlGaN layer conceivably easily moves toward the inner surfaces of the groove portions 131a having the V-shaped section when the AlGaN layer is formed on the n-type GaN substrate 131 by MOCVD or the like, similarly to the aforementioned fourth embodiment. Thus, the Al composition ratio of portions of the AlGaN layer formed on the inner surfaces of the groove portions 131a can be easily reduced below the Al composition ratio of portions of the AlGaN layer formed on regions other than the groove portions 131a. Regions 131b of the n-type GaN substrate 131 other than those formed with the groove portions 131a correspond to light-emitting portions located under ridge portions of a nitride-based semiconductor device layer. The regions 131b of the n-type GaN substrate 131 are examples of the "first region" in the present invention, and the regions of the n-type GaN substrate 131 formed with the groove portions 131a are examples of the "second region" in the present invention.

While the nitride-based semiconductor layers are crystal-grown by MOCVD in each of the aforementioned first to tenth embodiments, the present invention is not restricted to this but the nitride-based semiconductor layers may alternatively be crystal-grown by halide vapor phase epitaxy or gas source molecular beam epitaxy employing TMAl, TMGa, TMIn, $NH_3$, hydrazine, $SiH_4$, $GeH_4$ or $Mg(C_5H_5)_2$ as source gas.

While the GaN substrate having the surface of the (0001) plane, the (1-100) plane, (11-20) plane or the (11-22) plane is employed in each of the aforementioned first to tenth embodiments, a nitride-based semiconductor substrate misoriented from this plane in the range of not more than about 1.0° may alternatively be employed.

While the GaN substrate having the surface of the (11-22) plane is employed in each of the aforementioned ninth and tenth embodiments, the present invention is not restricted to this but a nitride-based semiconductor substrate having a plane direction along the (11-21), (11-23), (11-24), (11-25), (2-201), (1-101), (1-102), (1-103) or (1-104) plane.

While the active layer of the MQW structure is employed in each of the aforementioned first to tenth embodiments, the present invention is not restricted to this but similar effects can be attained also by employing an active layer of a single layer or a single quantum well structure having a large thickness with no quantum effect.

While the angle α (see FIG. 18) formed by the bottom surfaces and the side surfaces of the groove portions having the mesa sectional shape formed on the n-type GaN substrate is set to about 40° in each of the aforementioned fourth, seventh, eighth, ninth and tenth embodiments, the present invention is not restricted to this but the angle α formed by the bottom surfaces and the side surfaces of the groove portions may simply be at least about 15°. The side surfaces of the groove portions are preferably loosely inclined, so that the Al composition ratio of the portions of the nitride-based semiconductor layer (AlGaN layer) formed on the side surfaces of the groove portions can be more reduced below the Al composition ratio of the portions of the nitride-based semiconductor layer (AlGaN layer) formed on the regions other than the groove portions.

While the groove portions are formed to have a section substantially reflection-symmetrical with respect to the (0001) plane or the [11-22]-y plane in each of the aforementioned fourth, seventh, eighth and ninth embodiments, the groove portions may alternatively be formed to have an asymmetrical section. In other words, the bottom surfaces and the side surfaces of the groove portions 51a may alternatively form different angles α on the right and left portions respectively in FIG. 18.

Grooves extending in the [1-100] direction, the [11-20] direction or the direction perpendicular to the direction y may be further formed in addition to the groove portions extending in the [1-100] direction, the [11-20] direction or the direction y to provide latticelike groove portions in each of the aforementioned seventh to tenth embodiments.

In each of the aforementioned first to tenth embodiments, the depth of the groove portions is preferably larger than the thickness of the n-type layer of AlGaN or the p-type layer of AlGaN, more preferably in the range of 0.5 μm to 30 μm.

In each of the aforementioned first to tenth embodiments, further, the width of the grove portions is preferably larger than the thickness of the n-type layer of AlGaN or the p-type layer of AlGaN, more preferably in the range of 5 μm to 400 μm.

In each of the aforementioned first to tenth embodiments, in addition, the width of the regions corresponding to the light-emitting portions is preferably in the range of 10 μm to 400 μm.

What is claimed is:

1. A nitride-based semiconductor light-emitting device comprising:
    a nitride-based semiconductor substrate;
    a first region provided on said nitride-based semiconductor substrate and a second region arranged to be adjacent to said first region through a step portion having a prescribed height; and
    a nitride-based semiconductor layer formed on an upper surface of said first region of said nitride-based semiconductor substrate and a side surface of said step portion, wherein
    said nitride-based semiconductor layer includes a first conductive type cladding layer, an active layer and a second conductive type cladding layer successively formed from a side closer to said nitride-based semiconductor substrate, said first conductive type cladding layer has a different composition from said nitride-based semiconductor substrate as well as contains Al, Ga and N; and
    an Al composition ratio of said first conductive type cladding layer formed on the side surface of said step portion is lower than an Al composition ratio of said first conductive type cladding layer formed on the upper surface of said first region, and
    the upper surface of said first region of said nitride-based semiconductor substrate has a (H,K,-H-K,L) plane wherein H and K are integers, and at least either H or K is nonzero, wherein L is any number that allows the Al composition ratio of said first conductive type cladding layer formed on the side surface of said step portion to be lower than the Al composition ratio of said first conductive type cladding layer formed on the upper surface of said first region,
    wherein the first conductive type cladding layer comprises a single layer having an Al composition ratio in a portion of the single layer formed on the side surface of the step portion lower than an Al composition ratio in another portion of the corresponding single layer formed on the upper surface of said first region,
    wherein a thickness of the portion of the single layer formed on the side surface of the step portion is smaller than a thickness of the another portion of the corresponding single layer formed on the upper surface of the first region.

2. The nitride-based semiconductor light-emitting device according to claim 1, wherein said step portion has a step-like side surface.

3. The nitride-based semiconductor light-emitting device according to claim 1, wherein said second conductive type cladding layer has a ridge portion on said first region.

4. The nitride-based semiconductor light-emitting device according to claim 1, wherein the upper surface of said first region of said nitride-based semiconductor substrate has a (H,K,-H-K,0) plane.

5. The nitride-based semiconductor light-emitting device according to claim 1, wherein said step portion is so formed as to extend along a [K,-H, H-K,0] direction.

6. The nitride-based semiconductor light-emitting device according to claim 1, wherein said nitride-based semiconductor layer includes a layer, formed on said first region and said second region of said nitride-based semiconductor substrate, containing Al and Ga and a light-emitting layer of a nitride-based semiconductor formed at least on said first region.

7. The nitride-based semiconductor light-emitting device according to claim 1, wherein the upper surface of said first region of said nitride-based semiconductor substrate has a (1, −1, 0, L) plane and said step portion is so formed as to extend along a [1, 1, −2,0] direction.

8. The nitride-based semiconductor light-emitting device according to claim 1, wherein L is an integer.

9. The nitride-based semiconductor light-emitting device according to claim 1, wherein L is a nonzero integer.

10. The nitride-based semiconductor light-emitting device according to claim 1, wherein the upper surface of said first region of said nitride-based semiconductor substrate is misoriented by less than ±1.0° from a plane selected from the group consisting of a (1-100) plane, a (11-20) plane, a (11-22) plane, a (11-21) plane, a (11-23) plane, a (11-24) plane, a (11-25) plane, a (2-201) plane, a (1-101) plane, a (1-102) plane, a (1-103) plane, and a (1-104) plane.

11. The nitride-based semiconductor light-emitting device according to claim 7, wherein the upper surface of said first region of said nitride-based semiconductor substrate is misoriented by less than ±1.0° from a plane selected from the group consisting of a (1-101) plane, a (1-102) plane, a (1-103) plane, and a (1-104) plane.

* * * * *